(12) United States Patent
Bidaux

(10) Patent No.: US 11,796,305 B2
(45) Date of Patent: Oct. 24, 2023

(54) MAGNETIC POSITION SENSOR SYSTEM, DEVICE, MAGNET AND METHOD

(71) Applicant: Melexis Technologies SA, Bevaix (CH)

(72) Inventor: Yves Bidaux, Yverdon-les-Bains (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

(21) Appl. No.: 17/720,920

(22) Filed: Apr. 14, 2022

(65) Prior Publication Data

US 2022/0244034 A1 Aug. 4, 2022

Related U.S. Application Data

(63) Continuation of application No. 16/867,692, filed on May 6, 2020, now Pat. No. 11,326,868.

(30) Foreign Application Priority Data

May 23, 2019 (EP) .................................... 19176294

(51) Int. Cl.
*G01R 11/00* (2006.01)
*G01R 33/07* (2006.01)
(Continued)

(52) U.S. Cl.
CPC ............... *G01B 7/30* (2013.01); *G01B 7/023* (2013.01); *G01D 5/145* (2013.01); *G01R 33/07* (2013.01)

(58) Field of Classification Search
CPC .......... G01B 7/023; G01B 7/30; G01D 5/145; G01R 33/07
See application file for complete search history.

(56) References Cited

U.S. PATENT DOCUMENTS 3,710,158 A * 1/1973 Bachle .................. H02K 21/145
310/67 R
6,989,622 B1 * 1/2006 Chen ...................... H02K 19/22
310/263
(Continued)

FOREIGN PATENT DOCUMENTS

| EP | 3457155 A1 | 3/2019 |
| WO | 2014029885 A1 | 2/2014 |
| WO | 2018122283 A1 | 7/2018 |

OTHER PUBLICATIONS

European Search Report from EP Application No. EP19176294.7, dated Oct. 30, 2019.
(Continued)

*Primary Examiner* — Alesa Allgood
(74) *Attorney, Agent, or Firm* — WORKMAN NYDEGGER

(57) ABSTRACT

A position sensor system for determining a position of a sensor device relative to a magnetic structure, the system comprising: said magnetic structure comprising a plurality of non-equidistant poles; said sensor device comprising at least three magnetic sensors spaced apart over predefined distances; and the sensor device being adapted for: a) measuring at least three in-plane magnetic field components, and for calculating two in-plane field gradients therefrom; b) measuring at least three out-of-plane magnetic field components, and for calculating two out-of-plane field gradients therefrom; c) calculating a coarse signal based on these gradients; d) calculating a fine signal based on these gradients; e) determining said position based on the coarse signal and the fine signal.

20 Claims, 14 Drawing Sheets

(51) Int. Cl.
  *G01D 5/14*  (2006.01)
  *G01B 7/30*  (2006.01)
  *G01B 7/02*  (2006.01)

(56) References Cited

U.S. PATENT DOCUMENTS

| | | |
|---|---|---|
| 9,279,702 B2 | 3/2016 | Ritter et al. |
| 2011/0291645 A1 | 12/2011 | Franke et al. |
| 2012/0084051 A1 | 4/2012 | Hackner et al. |
| 2013/0099777 A1 | 4/2013 | Heberle |
| 2015/0115940 A1 | 4/2015 | Haible |
| 2016/0041010 A1* | 2/2016 | Hara .................... G01D 5/2451 |
| | | 324/207.13 |
| 2016/0069708 A1 | 3/2016 | Ausserlechner |
| 2017/0010594 A1 | 1/2017 | Kottapalli et al. |
| 2017/0054397 A1* | 2/2017 | Hanaka ................. H02P 25/064 |
| 2017/0241802 A1 | 8/2017 | Ausserlechner |
| 2019/0346285 A1 | 11/2019 | Kimmerle |

OTHER PUBLICATIONS

Nara et al., "A Closed-Form Formula for Magnetic Dipole Localization by Measurement of Its Magnetic Field and Spatial Gradients," IEEE Transactions on Magnetics, vol. 42, No. 10, Oct. 2006, pp. 3291-3293.

* cited by examiner

Example with 6 Horizontal Hall and 3 Integrated Magn Concentrators

Example with 8 Horizontal Hall and 4 Integrated Magn Concentrators

Example with 3 Horizontal Hall and 3 Vertical Hall elements

Example with 4 Horizontal Hall and 4 Vertical Hall elements

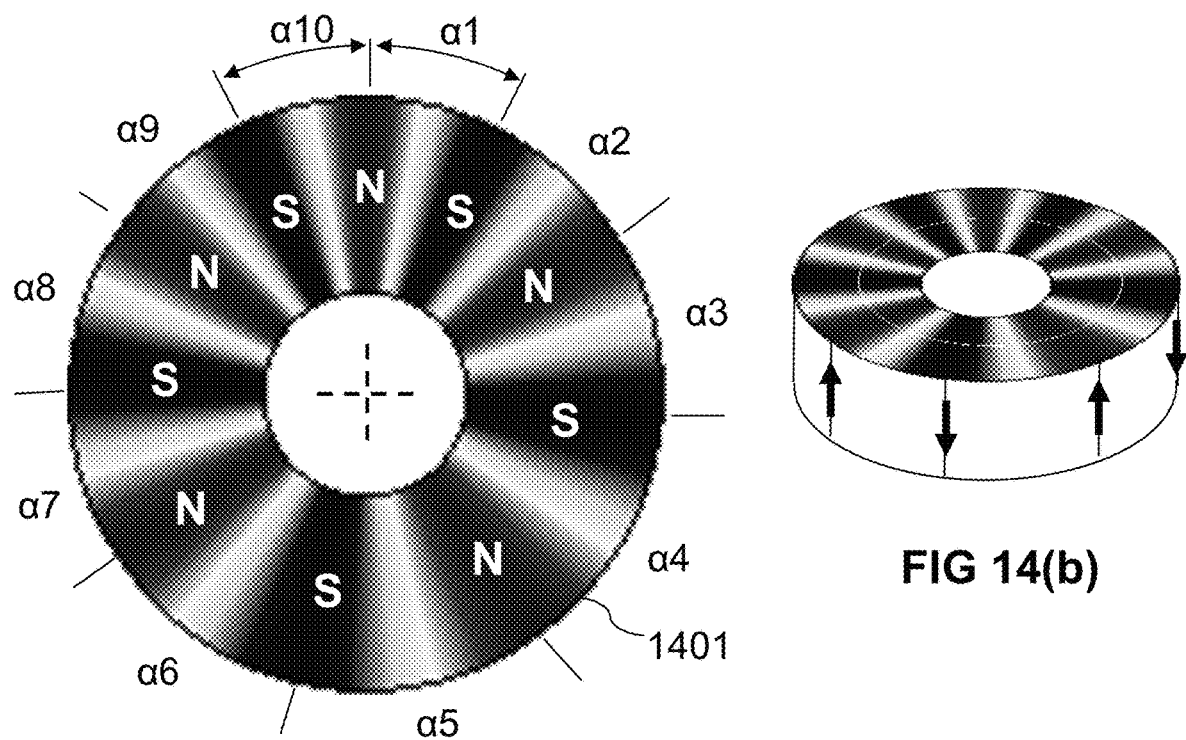
FIG 14(a)
FIG 14(b)
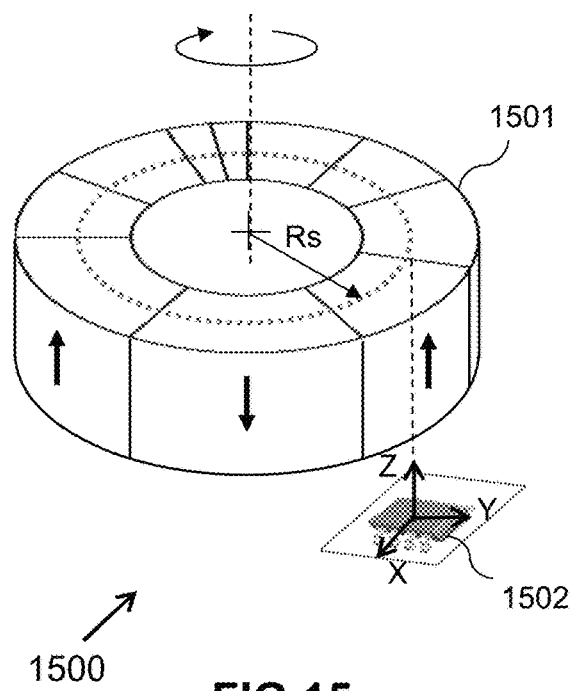
FIG 15

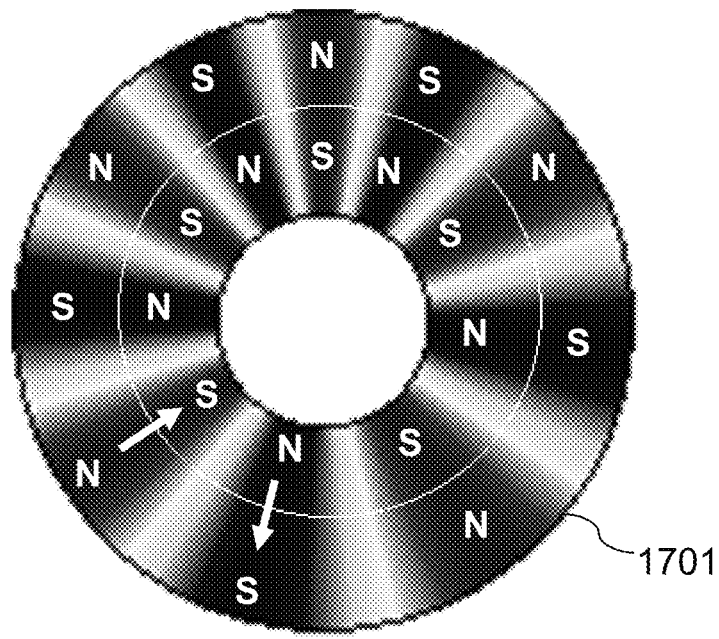
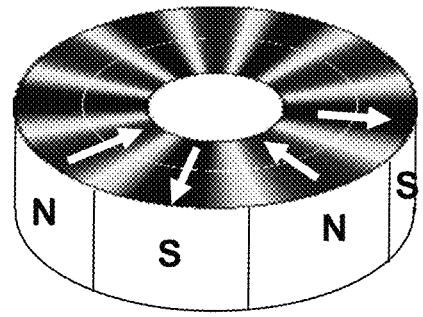
FIG 17(b)
FIG 17(a)
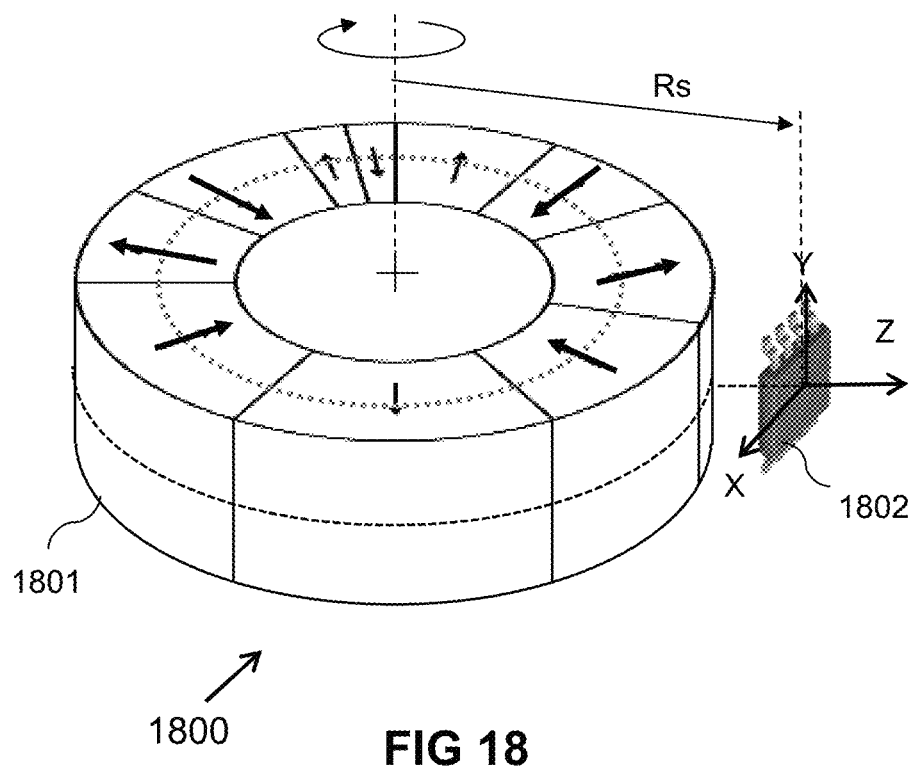
FIG 18

MAGNETIC POSITION SENSOR SYSTEM, DEVICE, MAGNET AND METHOD

FIELD OF THE INVENTION

The present invention relates in general to the field of magnetic position sensor devices, methods and systems, and more in particular to a position sensor device, method and system for determining a position over a relatively large range with relatively high accuracy, and to a special magnet or magnetic structure.

BACKGROUND OF THE INVENTION

Magnetic sensor systems, in particular linear position sensor systems and angular position sensor systems are known in the art. They offer the advantage of being able to measure a linear or angular position without making physical contact, thus avoiding problems of mechanical wear, scratches, friction, etc.

Many variants of position sensor systems exist, solving one or more of the following requirements: using a simple or cheap magnetic structure, using a simple or cheap sensor device, being able to measure over a relatively large range, being able to measure with great accuracy, requiring only simple arithmetic, being able to measure at high speed, being highly robust against positioning errors, being highly robust against an external disturbance field, providing redundancy, being able to detect an error, being able to detect and correct an error, having a good signal-to-noise ratio (SNR), etc.

Often two or more of these requirements conflict with each other, hence a trade-off needs to be made. A typical example is the trade-off between a large measurement range and high accuracy.

There is always room for improvements or alternatives.

SUMMARY OF THE INVENTION

It is an object of embodiments of the present invention, to provide a position sensor device, and a method of determining a position of a position sensor device relative to a magnetic structure, and to provide a position sensor system comprising such a device and such a magnetic structure, and to a special magnet or magnetic structure for use in such a system.

It is an object of embodiments of the present invention, to provide a position sensor device, method and system for determining a position of a position sensor device relative to a magnetic structure in the form of a permanent magnet structure having a plurality of poles, e.g. a plurality of alternating poles.

It is also an object of embodiments of the present invention to provide a magnetic structure and a position sensor device which can be used in such a position sensor system.

It is a particular object of embodiments of the present invention, to provide a position sensor system having a relatively large measurement range and a relatively high accuracy, and to a method of determining a position having the same properties.

It is an object of embodiments of the present invention, to provide a position sensor device, and method and system that is substantially insensitive to an external disturbance field.

It is an object of embodiments of the present invention, to provide a position sensor system and method which requires only relatively simple arithmetic (such as for example addition, subtraction, multiplication, division, a look-up table, interpolation) that can be performed on a simple micro-controller, but not including a Discrete Fourier-Transform (DFT) or Fast Fourier Transform (FFT) which typically requires a Digital Signal Processor (DSP) with a Multiply-Accumulate-instruction, and typically also requires considerably more random-access-memory (RAM).

It is an object of embodiments of the present invention, to provide a position sensor device, method and system using one or more permanent magnets, where the position determination is substantially robust against demagnetization of said magnet(s).

These objectives are accomplished by a position sensor system, and by a method for determining a position, and by a position sensor device, and by a magnet or magnetic structure according to embodiments of the present invention.

According to a first aspect, the present invention provides a position sensor device for use in a position sensing system wherein the position sensor device is movable relative to a magnetic structure having a plurality of poles, the position sensor device comprising: a semiconductor substrate; at least three sensors (e.g. S1, S2, S3) for measuring at least three first magnetic field components (e.g. Bx1, Bx2, Bx3), also referred to herein as "in-plane magnetic field components", oriented in a first direction (e.g. X) substantially parallel to the substrate on at least three different locations (e.g. X1, X2, X3) spaced apart over predefined distances (e.g. $\Delta x12$ between S1 and S2, e.g. $\Delta x23$ between S2 and S3) along the first direction, and for measuring at least three second magnetic field components (e.g. Bz1, Bz2, Bz3), also referred to herein as "out-of-plane magnetic field components", oriented in a second direction (e.g. Z) oriented substantially perpendicular to the substrate on said at least three different locations (e.g. X1, X2, X3); a processing unit adapted for: a) calculating two first gradients (e.g. $\Delta Bx12/\Delta x12$, $\Delta Bx23/\Delta x23$) of the first magnetic field components (e.g. Bx1, Bx2, Bx3) along the first direction (also referred to herein as "in-plane gradients"); b) calculating two second gradients (e.g. $\Delta Bz12/\Delta x12$, $\Delta Bz23/\Delta x23$) of the second magnetic field components (e.g. Bz1, Bz2, Bz3) along the first direction, (also referred to herein as "out-of-plane gradients"); c) calculating a coarse signal (Sc) based on at least some or all of the first and second gradients; d) calculating a fine signal (Sf) based on at least some of the first and second gradients; e) determining a position (e.g. X, α) based on the coarse signal (Sc) and the fine signal (Sf).

It is noted that the predefined distance $\Delta x12$ between the first sensor S1 and the second sensor S2 may be the same as the predefined distance $\Delta x23$ between the second sensor S2 and the third sensor S3, but that is not absolutely required. Different distances can easily be taken into account by appropriate scaling of the respective differences. Preferably the three sensors are equidistant from each other, i.e. $\Delta x12=\Delta x23$.

In case of four sensors, preferably the distance $\Delta x12$ between the first and second sensor is equal to the distance $\Delta x34$ between the third and four sensor, but that is not absolutely required. Preferably the four sensors are equidistant from each other, i.e. $\Delta x12=\Delta x23=\Delta x34$.

The at least three or at least four sensors may be located on a virtual line (collinear), but that is not absolutely required.

The coarse signal is indicative of the relative position in a first range (e.g. in an overall range corresponding to a distance spanned by the plurality of poles). The fine signal is indicative of the relative position in a second range which is a subset of the first range (e.g. in a range corresponding to two adjacent poles).

It is an advantage of this position sensor device that it uses a combination of a coarse signal and a fine signal, because in this way the fine granularity (high accuracy) can be combined with a large range.

It is an advantage of this position sensor device that the position can be determined using a relatively simple controller and does not require a powerful processor, such as a Digital Signal Processor (DSP), because the mathematics required for determining the position can for example be based on basic operations like additions, subtractions, multiplications, divisions, a goniometric function and/or a look-up table, but does not require for example a Discrete Fourier Transform (DFT). It is noted that also the goniometric function itself can be performed using a look-up table, and optional interpolation.

It is a major advantage of this position sensor device that both the fine signal as well as the coarse signal are based on gradient signals, which are insensitive to a (substantially constant) external disturbance field (also referred to as "stray field"), hence also the combined signal is highly insensitive to an external stray field.

It is an advantage of this position sensor device that a rough position indication can be quickly determined based on the coarse signal alone, if required or desired.

It is an advantage that the position of the sensor device relative to the magnetic structure is uniquely defined by the combination of the fine and the coarse signal. This is true even if the coarse signal does not vary strictly monotonically.

It is an advantage of this position sensor device, and of a position sensor system in which this device is used, that the fine signal and the coarse signal contain at least some redundancy, in the sense that they allow to determine an inconsistency between the two signals, or the presence of a relatively (too) large disturbance field. Depending on the application, this information can be used to detect an error condition.

It is an advantage of this position sensor device, and of a position sensor system in which this device is used, that the position of the sensor device relative to the magnetic structure can be uniquely determined without first having to move to a "known position", e.g. after power-ON.

Preferably the movement trajectory is located in a single plane. Preferably the sensor device comprises a semiconductor substrate which is oriented parallel to said single plane. The at least three in-plane magnetic field components (e.g. Bx1, Bx2, Bx3) are preferably measured in the movement direction (in case of a linear movement trajectory), or tangential to the movement trajectory (in case the movement trajectory is circular or curved). The at least three out-of-plane magnetic field components (e.g. Bz1, Bz2, Bz3) are preferably oriented perpendicular to the semiconductor plane.

The position sensor device is preferably oriented such that the first direction (e.g. X) is oriented in a direction parallel to or tangential to the direction of (relative) movement. Hence the first (or "in-plane") magnetic field components (e.g. Bx) are parallel or tangential to the direction of relative movement, and the second (or "out-of-plane") magnetic field components (e.g. Bz) are oriented perpendicular to the direction of (relative) movement.

In an embodiment, the position sensor device comprises at least three sensors (e.g. S1, S2, S3), and is adapted for calculating the coarse signal (Sc) as a function of the two first gradients (e.g. $\Delta Bx12/\Delta x12$, $\Delta Bx23/\Delta x23$) and the two second gradients (e.g. $\Delta Bz12/\Delta x12$, $\Delta Bz23/\Delta x23$).

In an embodiment, the position sensor device comprises at least three sensors (S1, S2, S3), and is adapted for calculating the coarse signal (Sc) based on a linear combination (e.g. a difference) of a first value and a second value (v1, v2), the first value (v1) being a function (e.g. a goniometric function) of the first (in-plane) and second (out-of-plane) gradient of the component signals obtained from the first and second sensor (S1, S2), and the second value (v2) being a function (e.g. a goniometric function) of the first (in-plane) and second (out-of-plane) gradient of the component signals obtained from the second and third sensor (S2, S3). The function may be a goniometric function, e.g. an arctangent function, or an arctan 2 function.

In an embodiment, the position sensor device comprises at least three sensors, and is adapted for calculating the coarse signal (Sc) as a function (e.g. a goniometric function or a polynomial expression) of a first ratio (R1) and a second ratio (R2), wherein the first ratio (R1) is calculated as a ratio of the first (in-plane) gradient and the second (out-of-plane) gradient obtained from the first and second sensor (S1, S2), and wherein the second ratio (R2) is calculated as a ratio of the first (in-plane) gradient and the second (out-of-plane) gradient obtained from the second and third sensor (S2, S3). This can be written as follows:

$$R1 = (\Delta Bx12/\Delta x12, \Delta Bz12/\Delta x12),$$

$$R2 = (\Delta Bx23/\Delta x23, \Delta Bz23/\Delta x23),$$

$$Sc = f(R1, R2).$$

Since $\Delta x12$ is present in the nominator and denominator of R1, the division by $\Delta x12$ can be omitted. Likewise, the division by $\Delta x23$ can be omitted in R2. Hence, this can be simplified to:

$$R1 = \Delta Bx12/\Delta Bz12,$$

$$R2 = \Delta Bx23/\Delta Bz23,$$

$$Sc = f(R1, R2).$$

In an embodiment, the position sensor device comprises at least three sensors and is adapted for calculating the coarse signal (Sc) based on the following formulas:

$$v1 = \arctan 2(K^* \Delta Bx12/\Delta x12, \Delta Bz12/\Delta x12),$$

$$v2 = \arctan 2(K^* \Delta Bx23/\Delta x23, \Delta Bz23/\Delta x23),$$

$$delta = (v1 - v2 + n^*360°),$$

$$Sc = delta, \text{ or } Sc = 1/delta,$$

where K is a predefined constant or is a predefined function of temperature, n is an integer chosen such that delta lies in the range from 0° to 360°, Sc is the coarse signal, atan2 or arctan 2 is the two-argument arctangent function, $\Delta Bx12/\Delta x12$ is a first gradient (or "in-plane gradient") of the first magnetic field components (Bx1, Bx2) obtained from the first and second sensor, $\Delta Bx23/\Delta x23$ is a first gradient of the first magnetic field components (Bx2, Bx3) obtained from the second and third sensor, $\Delta Bz12/\Delta x12$ is a second gradient (or "out-of-plane gradient") of the second magnetic field components (Bz1, Bz2) obtained from the first and second sensor, and $\Delta Bz23/\Delta x23$ is a second gradient of the second magnetic field components (Bz2, Bz3) obtained from the second and third sensor.

For the same reason as explained above, the division by $\Delta x12$ and $\Delta x23$ can be omitted, and thus the formula for v1 and v2 can be simplified to:

$$v1=\arctan 2(K^*\Delta Bx12, \Delta Bz12), \text{ and}$$

$$v2=\arctan 2(K^*\Delta Bx23, \Delta Bz23).$$

K may be a predefined constant equal to 1.0. K may be a predefined constant different from 1.0, for example smaller than 0.95 or larger than 1.05. In some embodiments, K is determined as a function K(T) of temperature. The position sensor device may comprise a temperature sensor to this end. This temperature sensor may be configured for measuring a substrate temperature at any location.

The value of K may be chosen such that, for a particular position of the sensor device relative to the magnet, the magnitude of K*dBx/dx is substantially equal to the magnitude of dBz/dx, or the magnitude of K*$\Delta$Bx12 is substantially equal to the magnitude of $\Delta$Bz12 over the envisioned measurement range. The value of K, or the values or parameters of the function K(T) may be determined during calibration or simulation and may be stored in a non-volatile memory.

In an embodiment, the position sensor device comprises at least four magnetic sensors, and is adapted for calculating the coarse signal (Sc) based on the following set of formulas:

$$v1=\arctan 2(K^*\Delta Bx12/\Delta x12, \Delta Bz12/\Delta x12),$$

$$v2=\arctan 2(K^*\Delta Bx34/\Delta x34, \Delta Bz34/\Delta x34),$$

$$\text{delta}=(v1-v2+n^*360°),$$

$$Sc=\text{delta, or } Sc=1/\text{delta,}$$

where K is a predefined constant or is a predefined function of temperature, n is an integer chosen such that delta lies in the range from 0° to 360°, Sc is the coarse signal, atan2 or arctan 2 is the two-argument arctangent function, $\Delta$Bx12/$\Delta$x12 is a first gradient (or "in-plane gradient") of the first magnetic field components (Bx1, Bx2) obtained from the first and second sensor, $\Delta$Bx34/$\Delta$x34 is a first gradient of the first magnetic field components (Bx3, Bx4) obtained from the third and fourth sensor, $\Delta$Bz12/$\Delta$x12 is a second gradient (or "out-of-plane gradient") of the second magnetic field components (Bz1, Bz2) obtained from the first and second sensor, and $\Delta$Bz34/$\Delta$x34 is a second gradient of the second magnetic field components (Bz3, Bz4) obtained from the third and fourth sensor.

Because the arctan 2 function is based on a ratio of its two arguments, the formulas for v1 and v2 can be simplified to:

$$v1=\arctan 2(K^*\Delta Bx12, \Delta Bz12),$$

$$v2=\arctan 2(K^*\Delta Bx34, \Delta Bz34).$$

As mentioned above, K may be a predefined constant equal to 1.0, or K may be a predefined constant different from 1.0, or K may be determined by a function K(T) of temperature.

It is an advantage of these formulas, that the coarse signal is substantially insensitive to demagnetization effects of the magnet, but moreover, since the signal is based on differential signals, is robust against an external disturbance field. It is noted that the coarse signal may monotonically increase or monotonically decrease over the measurement range of interest, but that is not absolutely required. Instead, what is required is that the combination of a particular fine signal value and the corresponding coarse signal value is unique for every location to be measured.

In an embodiment, the position sensor device comprises at least three sensors (S1, S2, S3) or at least four sensors (S1, S2, S3, S4), and is adapted for calculating the fine signal (Sf) based on a ratio of the two first gradients ($\Delta$Bx12/$\Delta$x12, $\Delta$Bx23/$\Delta$x23), or based on a ratio of the two second gradients ($\Delta$Bx34/$\Delta$x34, $\Delta$Bz34/$\Delta$x34).

In an embodiment, the position sensor device comprises at least three sensors (S1, S2, S3) or at least four sensors (S1, S2, S3, S4), and is adapted for calculating the fine signal (Sf) based on a goniometric function of a ratio of the two first gradients, or based on a goniometric function of a ratio of the two second gradients.

In an embodiment, the position sensor device comprises at least three sensors, and is adapted for calculating the fine signal (Sf) based on one of the following formulas:

$$Sf=\arctan 2(K^*\Delta Bx12/\Delta x12, \Delta Bz12/\Delta x12), \text{ or}$$

$$Sf=\arctan 2(K^*\Delta Bx23/\Delta x23, \Delta Bz23/\Delta x23), \text{ or}$$

$$Sf=\arctan 2(K^*\Delta Bx13/\Delta x13, \Delta Bz13/\Delta x13)$$

wherein Sf is the fine signal, atan2 or arctan 2 is the two-argument arctangent function, K is a predefined constant or is a predefined function of temperature, $\Delta$Bx12/$\Delta$x12 is a first gradient of the first magnetic field components (Bx1, Bx2) obtained from the first and second sensor (S1, S2), $\Delta$Bx23/$\Delta$x23 is a first gradient of the first magnetic field components (Bx2, Bx3) obtained from the second and third sensor (S2, S3), $\Delta$Bx13/$\Delta$x13 is a first gradient of the first magnetic field components (Bx1, Bx3) obtained from the first and third sensor (S1, S3), $\Delta$Bz12/$\Delta$x12 is a second gradient of the second magnetic field components (Bz1, Bz2) obtained from the first and second sensor (S1, S2), $\Delta$Bz23/$\Delta$x23 is a second gradient of the second magnetic field components (Bz2, Bz3) obtained from the second and third sensor (S2, S3), $\Delta$Bz13/$\Delta$x13 is a second gradient of the second magnetic field components (Bz1, Bz3) obtained from the first and third sensor (S1, S3).

As mentioned above, K may be a predefined constant equal to 1.0, or K may be a predefined constant different from 1.0, or K may be determined by a function K(T) of temperature.

For the same reasons as mentioned above, the formulas for Sf can be simplified to:

$$Sf=\arctan 2(K^*\Delta Bx12, \Delta Bz12), \text{ or}$$

$$Sf=\arctan 2(K^*\Delta Bx23, \Delta Bz23), \text{ or}$$

$$Sf=\arctan 2(K^*\Delta Bx13, \Delta Bz13)$$

In an embodiment, the position sensor device comprises at least three sensors, which are spaced equidistantly, and is adapted for calculating the fine signal (Sf) based on a second order gradient, according to the following set of formulas:

$$\Delta^2 Bx/\Delta x^2=(\Delta Bx23/\Delta x)-(\Delta Bx12/\Delta x)$$

$$\Delta^2 Bz/\Delta x^2=(\Delta Bz23/\Delta x)-(\Delta Bz12/\Delta x)$$

$$Sf=\arctan 2(L^*\Delta^2 Bx/\Delta x^2, \Delta^2 Bz/\Delta x^2),$$

where L is a predefined constant, or a function of temperature. These formulas can also be written as:

$$d^2Bx=(\Delta Bx23-\Delta Bx12),$$

$$d^2Bz=(\Delta Bz23-\Delta Bz12),$$

$$Sf=\arctan 2(L^*d^2Bx, d^2Bz).$$

In an embodiment, the position sensor device comprises at least four sensors, and is adapted for calculating the fine signal (Sf) based on one of the following formulas:

$$Sf = \arctan 2(K^* \Delta Bx12/\Delta x12, \Delta Bz12/\Delta x12), \text{ or}$$

$$Sf = \arctan 2(K^* \Delta Bx23/\Delta x23, \Delta Bz23/\Delta x23), \text{ or}$$

$$Sf = \arctan 2(K^* \Delta Bx34/\Delta x34, \Delta Bz34/\Delta x34)$$

wherein Sf is the fine signal, atan2 or arctan 2 is the two-argument arctangent function, K is a predefined constant or is a predefined function of temperature, $\Delta Bx12/\Delta x12$ is a first gradient of the first magnetic field components (Bx1, Bx2) obtained from the first and second sensor (S1, S2), $\Delta Bx23/\Delta x23$ is a first gradient of the first magnetic field components (Bx2, Bx3) obtained from the second and third sensor (S2, S3), $\Delta Bx34/\Delta x34$ is a first gradient of the first magnetic field components (Bx3, Bx4) obtained from the third and fourth sensor (S3, S4), $\Delta Bz12/\Delta x12$ is a second gradient of the second magnetic field components (Bz1, Bz2) obtained from the first and second sensor (S1, S2), $\Delta Bz23/\Delta x23$ is a second gradient of the second magnetic field components (Bz2, Bz3) obtained from the second and third sensor (S2, S3), $\Delta Bz34/\Delta x34$ is a second gradient of the second magnetic field components (Bz3, Bz4) obtained from the third and fourth sensor (S3, S4).

For the same reasons as mentioned above, these formulas can also be written as:

$$Sf = \arctan 2(K^* \Delta Bx12, \Delta Bz12), \text{ or}$$

$$Sf = \arctan 2(K^* \Delta Bx23, \Delta Bz23), \text{ or}$$

$$Sf = \arctan 2(K^* \Delta Bx34, \Delta Bz34)$$

But of course, Sf can also be determined based on an arctangent function of a ratio of the signals obtained from sensor S1 and sensor S3, or the signals obtained from S1 and S4, or the signals obtained from S2 and S4.

In an embodiment, the position sensor device comprises four sensors, which are spaced equidistantly, and is adapted for calculating the fine signal (Sf) based on a second order gradient, according to the following set of formulas:

$$\Delta^2 Bx/\Delta x^2 = (\Delta Bx34/\Delta x) - (\Delta Bx12/\Delta x)$$

$$\Delta^2 Bz/\Delta x^2 = (\Delta Bz34/\Delta x) - (\Delta Bz12/\Delta x)$$

$$Sf = \arctan 2(L^* \Delta^2 Bx/\Delta x^2, \Delta^2 Bz/\Delta x^2),$$

where L is a predefined constant, or a function of temperature. These formulas can also be written as:

$$d^2 Bx = \Delta Bx34 - \Delta Bx12,$$

$$d^2 Bz = \Delta Bz34 - \Delta Bz12,$$

$$Sf = \arctan 2(L^* d^2 Bx, d^2 Bz)$$

It is an advantage that the fine signal Sf (or a value derived therefrom) is substantially insensitive to demagnetization effects, because it is based on a ratio.

It is an advantage that the fine signal Sf is highly robust against a (constant) external disturbance field, because it is based on magnetic field gradients.

In an embodiment, the position sensor device is adapted for determining said position by determining a plurality of at least two candidate positions (e.g. xA, xB) based on the fine signal only, and then selecting one of these candidate positions considering also the coarse signal.

The second step (selecting) may include selecting the candidate position for which the coarse signal deviates least with a predefined coarse position associated with said fine signal.

In an embodiment, each magnetic sensor comprises an integrated magnetic concentrator (IMC) and a pair of two horizontal Hall elements arranged on opposite sides of the magnetic concentrator, e.g. as illustrated in FIG. 4(a) or FIG. 4(b).

Preferably the horizontal Hall elements of the plurality of magnetic sensors are collinear.

It is an advantage that each such "magnetic sensor" comprising a pair of horizontal Hall elements and a magnetic concentrator can measure Bx and Bz at one sensor location. Hence three such "magnetic sensors" allow to measure a value of Bx and Bz at three different sensor locations. A pairwise subtraction of the Bx-values and the Bz-values of adjacent sensor structures allow to calculate the gradients (or spatial derivatives).

In an embodiment, each magnetic sensor comprises a horizontal Hall element and a vertical Hall element, as illustrated for example in FIG. 5(a) and FIG. 5(b).

The distances $\Delta x12$, $\Delta x23$ between centers of the horizontal Hall elements and the distances between centers of the vertical Hall elements is preferably the same, but that is not absolutely required.

In an embodiment, the distance between centers of the vertical Hall elements is larger than the distance between centers of the horizontal Hall elements, e.g. at least 5% to 10% larger, without having to increase the size of the substrate. In this way, the signals obtained from the vertical Hall elements can be (slightly) increased, hence, the SNR can be slightly increased, and the accuracy of the determined position can be improved.

In an embodiment, the position sensor device comprises three horizontal Hall elements equidistantly spaced over a first distance in a first direction and comprises three vertical Hall elements equidistantly spaced over a second distance in the first direction.

The first distance may be equal to the second distance, but that is not absolutely required. The horizontal Hall elements (without IMC) are adapted to measure the out-of-plane magnetic field vector Bz (oriented perpendicular to the sensor substrate) at three different sensor locations. The three vertical Hall elements are adapted to measure the in-plane magnetic field vector Bx (oriented parallel to the sensor substrate). By determining Bx and Bz at three different sensor locations, two gradients (or spatial derivatives) dBx/dx and dBz/dx can be calculated by pairwise subtraction.

According to a second aspect, the present invention also provides a method of determining a position of a position sensor device in a position sensing system, wherein the position sensor device is movable relative to a magnetic structure having a plurality of poles, and wherein the position sensor device comprises: a semiconductor substrate, and at least three sensors for measuring at least three first magnetic field components (e.g. Bx1, Bx2, Bx3) oriented in a first direction (e.g. X) substantially parallel to the substrate on at least three different locations (e.g. X1, X2, X3) spaced apart over predefined distances (e.g. $\Delta x12$, $\Delta x23$) along the first direction, and for measuring at least three second magnetic field components (e.g. Bz1, Bz2, Bz3) oriented in a second direction (e.g. Z) oriented substantially perpendicular to the substrate on said at least three different locations, and a processing unit; the method comprising the steps of: a) measuring a first magnetic field component (e.g.

Bx1, Bx2, Bx3) in said at least three locations (e.g. X1, X2, X3), and calculating two first gradients (e.g. ΔBx12/Δx12, ΔBx23/Δx23) of the first magnetic field components along the first direction; b) measuring a second magnetic field component (e.g. Bz1, Bz2, Bz3) in said at least three locations, and calculating two second gradients (e.g. ΔBz12/Δx12, ΔBz23/Δx23) of the second magnetic field components along the first direction; c) calculating a coarse signal (Sc) based on at least some of the first and second gradients; d) calculating a fine signal (Sf) based on at least some of the first and second gradients; e) determining a position (e.g. X, α) based on the coarse signal (Sc) and the fine signal (Sf).

As described above, the main advantages of this method are that a unique position can be determined, that the position can be accurate thanks to the fine signal, that an absolute position can be determined thanks to the coarse signal, that the position thus determined is substantially insensitive to magnetic degradation, and to an external disturbance field (if present).

It is a further advantage that this method can be performed by a simple processor, (for example an 8-bit or 16-bit processor running at a moderate clock speed, e.g. lower than 40 MHz).

In an embodiment, each of the coarse signal (Sc) and the fine signal (Sf) is derived from a ratio of an in-plane magnetic field gradient (e.g. dBx/dx) and an out-of-plane magnetic field gradient (e.g. dBz/dx).

In an embodiment, step c) comprises: calculating the coarse signal (Sc) based on a linear combination (e.g. a difference) of a first value and a second value (e.g. v1, v2), the first value (v1) being a function (e.g. a goniometric function) of the first (in-plane) and second (out-of-plane) gradient of the component signals obtained from the first and second sensor (S1, S2), and the second value (v2) being a function (e.g. a goniometric function) of the first (in-plane) and second (out-of-plane) gradient of the component signals obtained from the second and third sensor (S2, S3). The function may be a goniometric function, e.g. an arctangent function, or an arctan 2 function.

In an embodiment, step c) comprises: calculating the coarse signal (Sc) based on a first set of formulas, comprising:

$v1 = \arctan 2(K^* \Delta Bx12/\Delta x12, \Delta Bz12/\Delta x12)$, $v2 = \arctan 2(K^* \Delta Bx23/\Delta x23, \Delta Bz23/\Delta x23)$, delta = $(v1 - v2 + n^*360°)$, $Sc$ = delta, or $Sc$ = 1/delta, where K is a predefined constant or is a predefined function of temperature, n is an integer chosen such that delta lies in the range from 0° to 360°, Sc is the coarse signal, arctan 2 is the two-argument arctangent function, ΔBx12/Δx12 is a first gradient of the first magnetic field components (Bx1, Bx2) obtained from the first and second sensor (S1, S2), ΔBx23/Δx23 is a first gradient of the first magnetic field components (Bx2, Bx3) obtained from the second and third sensor (S2, S3), ΔBz12/Δx12 is a second gradient of the second magnetic field components (Bz1, Bz2) obtained from the first and second sensor (S1, S2), and ΔBz23/Δx23 is a second gradient of the second magnetic field components (Bz2, Bz3) obtained from the second and third sensor (S2, S3).

As mentioned above, K may be a predefined constant equal to 1.0, or K may be a predefined constant different from 1.0, or K may be determined by a function K(T) of temperature.

As described above, the formulas of v1 and v2 can be simplified by omitting the division by Δx12 and by Δx23.

In an embodiment, step c) comprises: calculating the coarse signal (Sc) based on a second set of formulas, comprising:

$v1 = \arctan 2(K^* \Delta Bx12/\Delta x12, \Delta Bz12/\Delta x12)$, $v2 = \arctan 2(K^* \Delta Bx34/\Delta x34, \Delta Bz34/\Delta x34)$, delta = $(v1 - v2 + n^*360°)$, $Sc$ = delta, or $Sc$ = 1/delta, where K is a predefined constant or is a predefined function of temperature, n is an integer chosen such that delta lies in the range from 0° to 360°, Sc is the coarse signal, arctan 2 is the two-argument arctangent function, ΔBx12/Δx12 is a first gradient of the first magnetic field components (Bx1, Bx2) obtained from the first and second sensor (S1, S2), ΔBx34/Δx34 is a first gradient of the first magnetic field components (Bx3, Bx4) obtained from the third and fourth sensor (S3, S4), ΔBz12/Δx12 is a second gradient of the second magnetic field components (Bz1, Bz2) obtained from the first and second sensor (S1, S2), and ΔBz34/Δx34 is a second gradient of the second magnetic field components (Bz3, Bz3) obtained from the third and fourth sensor (S3, S4). As mentioned above, K may be a predefined constant equal to 1.0, or K may be a predefined constant different from 1.0, or K may be determined by a function K(T) of temperature.

As described above, the formulas of v1 and v2 can be simplified by omitting the division by Δx12 and by Δx34.

In an embodiment, step d) comprises: calculating the fine signal (Sf) as a function of the first (in-plane) magnetic field gradient and the second (out-of-plane) magnetic field gradient of the signals obtained from two of said at least three sensors (e.g. S1 and S2, or S1 and S3, or S2 and S3). The function may be a goniometric function, e.g. an arctangent function, or an arctan 2 function.

In an embodiment, step d) comprises: calculating the fine signal (Sf) based on one of the following formulas:

$Sf = \arctan 2(K^* \Delta Bx12/\Delta x12, \Delta Bz12/\Delta x12)$, or $Sf = \arctan 2(K^* \Delta Bx23/\Delta x23, \Delta Bz23/\Delta x23)$, or $Sf = \arctan 2(K^* \Delta Bx34/\Delta x34, \Delta Bz34/\Delta x34)$ wherein Sf is the fine signal, arctan 2 is the two-argument arctangent function, K is a predefined constant or is a predefined function of temperature, ΔBx12/Δx12 is a first gradient of the first magnetic field components (Bx1, Bx2) obtained from the first and second sensor (S1, S2), ΔBx23/Δx23 is a first gradient of the first magnetic field components (Bx2, Bx3) obtained from the second and third sensor (S2, S3), ΔBx34/Δx34 is a first gradient of the first magnetic field components (Bx3, Bx4) obtained from the third and fourth sensor (S3, S4), ΔBz12/Δx12 is a second gradient of the second magnetic field components (Bz1, Bz2) obtained from the first and second sensor (S1, S2), ΔBz23/Δx23 is a second gradient of the second magnetic field components (Bz2, Bz3) obtained from the second and third sensor (S2, S3), ΔBz34/Δx34 is a second gradient of the second magnetic field components (Bz3, Bz4) obtained from the third and fourth sensor (S3, S4).

As described above, the formulas of Sf can be simplified by omitting the division by Δx12 and by Δx23, and by Δx34.

But of course, Sf can also be determined based on an arctangent function of a ratio of the signals obtained from sensor S1 and sensor S3, or the signals obtained from S1 and S4, or the signals obtained from S2 and S4.

In an embodiment, step d) comprises: calculating the fine signal (Sf) based on a second order gradient, according to the following set of formulas:

$$\Delta^2 Bx/\Delta x^2 = (\Delta Bx23/\Delta x) - (\Delta Bx12/\Delta x)$$

$$\Delta^2 Bz/\Delta x^2 = (\Delta Bz23/\Delta x) - (\Delta Bz12/\Delta x)$$

$$Sf = \arctan 2(L*\Delta^2 Bx/\Delta x^2, \Delta^2 Bz/\Delta x^2),$$

where L is a predefined constant, or a function of temperature,
or according to the following set of formulas:

$$\Delta^2 Bx/\Delta x^2 = (\Delta Bx34/\Delta x) - (\Delta Bx12/\Delta x)$$

$$\Delta^2 Bz/\Delta x^2 = (\Delta Bz34/\Delta x) - (\Delta Bz12/\Delta x)$$

$$Sf = \arctan 2(L*\Delta^2 Bx/\Delta x^2, \Delta^2 Bz/\Delta x^2).$$

As described above, these formulas of Sf can be simplified by omitting the division by/$\Delta x$ and by $\Delta x^2$.

In another or further embodiment, step e) comprises: determining said position by determining a plurality of at least two candidate positions (e.g. xA, xB) based on the fine signal (Sf), and then selecting one of these candidate positions (e.g. xA, xB) based on the coarse signal (Sc).

Step e) may comprise: choosing the candidate that shows the smallest deviation from a predetermined coarse signal corresponding to this fine signal, e.g. as determined during a calibration step, and stored in a non-volatile memory. The sensor device may comprise for example a look-up table with at least three columns, a first column storing values for the fine signal Sf, the second column storing values for the coarse signal Sc, the third column storing values of an actual displacement value along the direction of movement, or along the movement trajectory, and the method may include the step of finding the best matching value, e.g. using interpolation (e.g. linear interpolation).

According to a third aspect, the present invention also provides a computer-program-product for performing a method according to the second aspect, when being executed on a position sensor device according to the first aspect.

According to a fourth aspect, the present invention also provides a position sensor system comprising: a position sensor device according to the first aspect; a magnetic structure comprising a plurality of poles; the magnetic structure being movable relative to the position sensor device (or vice versa) in a movement direction or along a movement trajectory; wherein a distance (e.g. Xpp, αpp) between centres of adjacent poles of the magnetic structure varies along the movement direction or along the movement trajectory; wherein the sensor device is oriented such that its first axis (e.g. X) is tangential to the movement direction or movement trajectory.

In an embodiment, the position sensor device is movably arranged relative to the magnetic structure at a substantially constant distance from the magnetic structure.

In an embodiment, the magnetic structure comprises at least four, or at least five, or at least six pole pairs.

What is meant is that the sensor device is adapted for facing at least four, or at least five, etc. poles when moving along its trajectory.

In an embodiment, the magnetic structure is an assembly of a plurality of discrete permanent magnets.

In an embodiment, the magnetic structure comprises a monolithic magnetic material which is magnetized so as to have a plurality of poles, wherein adjacent poles are oriented in opposite directions.

In an embodiment, the magnetic structure has an (overall) elongated shape having a longitudinal axis (e.g. having a substantially linear shape).

This is referred to as "a linear position sensor system", in which case the position sensor device may be adapted for moving relative to the magnetic structure along a trajectory coinciding with or substantially parallel to said longitudinal axis.

In an embodiment, the magnetic structure has a curved shape having a curved axis (e.g. circular, spiral, elliptical, parabolic, etc).

This is referred to as an "angular position sensor system", in which case the sensor device may be adapted for moving relative to the magnetic structure along a trajectory coinciding with or located at a substantially constant distance from said curved axis. The curved axis may, but need not necessarily be closed. It can for example be a circle segment or an arc segment.

In an embodiment, the remanent magnetic field inside the magnetic material is oriented substantially perpendicular to said (e.g. linear or curved) axis.

Preferably the sensor device comprises a single semiconductor substrate, and the remanent magnetic field inside the magnetic material is oriented perpendicular to said semiconductor substrate.

In an embodiment, a remanent magnetic field inside the magnetic material is oriented substantially parallel to said second axis (e.g. Z).

In an embodiment, said distance between centres of adjacent poles varies strict monotonically along said first axis. In other words, when moving from a start position of the magnetic structure to an end position, the distance between centres of the poles increases or decreases for each new pole encountered.

In another embodiment, said distances between centres of adjacent poles increases over a first portion and decreases over a second portion.

According to a fifth aspect, the present invention also provides an axially or radially magnetized ring magnet comprising a plurality of alternating poles, wherein an angular distance (αi) between centres of adjacent poles measured at a periphery of the ring magnet, increases over a first angular portion and decreases over a second angular portion of a full 360° range, measured in clockwise direction.

The poles may have the shape of pie segments, in which case the axially or radially magnetized ring magnet comprises a plurality of pie segments spanning different arc segments of the periphery of the ring magnet.

In an embodiment, the ring magnet has exactly four pie segments, with four different adjacent pie sizes, namely size1, size2, size3, size4, wherein size1 is the smallest size, and size3 is the largest size, and wherein size1<size4<size2<size3, or wherein size1<size2<size4<size3.

In an embodiment, the ring magnet has exactly six pie segments, with six different adjacent pie sizes, namely size1, size2, size3, size4, size5, size6, wherein size1 is the smallest size, and size4 is the largest size, and wherein size1<size6<size2<size5<size3<size4, or wherein size1<size6<size2<size3<size5<size4, or wherein size1<size2<size6<size5<size3<size4, or wherein size1<size2<size6<size3<size5<size4, or wherein size1<size2<size6<size3<size5<size4.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 2(a) shows the sensor system in top view, and FIG. 2(b) shows the sensor system in perspective view. As can be seen, the sensor device is mounted off-axis (i.e. offset from the rotation axis, at a non-zero distance from the magnet axis).

FIG. 14(a) and FIG. 14(b) show an axially magnetized ring magnet according to an embodiment of the present invention, in top view and perspective view respectively, which can be seen as a variant of the ring magnet shown in FIGS. 2(a) and 2(b). The distances between adjacent poles of the ring magnet increase in a first portion and decrease in a second portion of the ring magnet.

FIG. 15 shows an angular position sensor system according to an embodiment of the present invention, comprising an axially magnetized magnet like the one shown in FIGS. 14(a) and 14(b), and a position sensor device located offset from the rotation axis, facing an circular or annular bottom surface of the magnet.

FIG. 17(a) and FIG. 17(b) show a radially magnetized ring magnet according to an embodiment of the present invention, in top view and perspective view respectively, which can be seen as a variant of the ring magnet shown in FIGS. 2(a) and 2(b) and in FIGS. 14(a) and 14(b). The distances between adjacent poles of the ring magnet increase in a first portion and decrease in a second portion of the ring magnet.

FIG. 18 shows an angular position sensor system according to an embodiment of the present invention, comprising a radially magnetized magnet like the one shown in FIGS. 17(a) and 17(b), and a position sensor device located outside of the magnet, facing a cylindrical side surface of the ring magnet.

Figure 1:
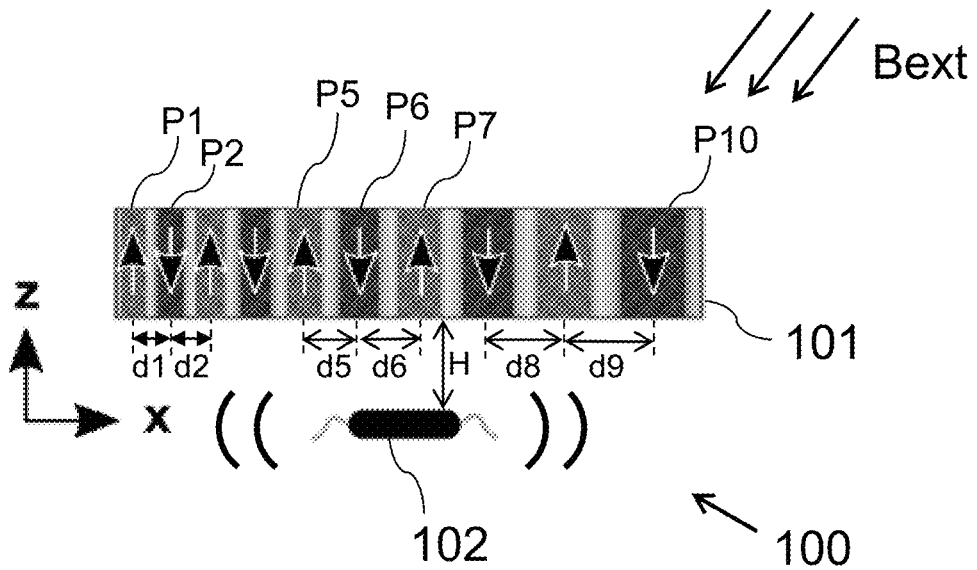
FIG. 1 is a schematic block-diagram of an exemplary linear position sensor system according to an embodiment of the present invention.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, unless explicitly mentioned otherwise, the term "magnetic sensor device" or "sensor device" refers to a device comprising at least one magnetic "sensor element". The sensor device may be comprised in a package, also called "chip", although that is not absolutely required. The sensor device typically comprises a semiconductor substrate.

In this document, the term "sensor plane", or "plane defined by the substrate of the sensor device" mean the same. They refer to a plane parallel to the semiconductor substrate.

In this document, the term "sensor element" or "magnetic sensor element" or "sensor" can refer to a component or a group of components or a sub-circuit or a structure capable of measuring a magnetic quantity, such as for example a magneto-resistive element, an XMR element, a horizontal Hall plate, a vertical Hall plate, a Wheatstone-bridge containing at least one (but preferably four) magneto-resistive elements, etc. or combinations hereof.

In this document, the expression "in-plane component of a vector" and "projection of the magnetic field component in the sensor plane" mean the same. If the sensor device is implemented in a semiconductor substrate, this also means "magnetic field components parallel to the semiconductor plane". The in-plane components may be further specified as a Bx-component and in a By-component. As used herein, the Bx-component typically refers to the in-plane component in a direction parallel to the movement direction in case of a linear position sensor, or tangential to the movement trajectory in case of a curved trajectory, and the By-component refers to the component perpendicular to the Bx-component (e.g. directed radially in case of an angular position sensor).

In this document, the expression "out-of-plane component of a vector" and "Z component of the vector" and "projection of the field component on an axis perpendicular to the sensor plane" mean the same.

In this document, the expression "spatial derivative" or "derivative" or "spatial gradient" or "gradient" are used as synonyms, unless clear from the context that something else was meant. In the context of the present invention. the gradient is determined as a difference between two values measured at two locations spaced apart in the X-direction, where the X-direction means "parallel to the direction of movement" in case of a linear position sensor", or "tangential to the movement trajectory" in case of a curved movement trajectory, e.g. an angular position sensor.

It is an object of the present invention, to provide a position sensor system, e.g. an absolute position sensor system, and a method of determining a position of a sensor device relative to a magnetic structure.

The present invention provides a position sensor device for use in a position sensing system wherein the position sensor device is movable relative to a magnetic structure having a plurality of poles, the position sensor device comprising: a semiconductor substrate; at least three sensors (e.g. S1, S2, S3) for measuring at least three first magnetic field components (e.g. Bx1, Bx2, Bx3), also referred to herein as "in-plane magnetic field components", oriented in a first direction (e.g. X) substantially parallel to the substrate on at least three different locations (e.g. X1, X2, X3) spaced apart over predefined distances (e.g. Δx12 between S1 and S2, e.g. Δx23 between S2 and S3) along the first direction, and for measuring at least three second magnetic field components (e.g. Bz1, Bz2, Bz3), also referred to herein as "out-of-plane magnetic field components", oriented in a second direction (e.g. Z) oriented substantially perpendicular to the substrate on said at least three different locations (e.g. X1, X2, X3); a processing unit adapted for: a) calculating two first gradients (e.g. ΔBx12/Δx12, ΔBx23/Δx23) of the first magnetic field components (e.g. Bx1, Bx2, Bx3) along the first direction (also referred to herein as "in-plane gradients"); b) calculating two second gradients (e.g. ΔBz12/Δx12, ΔBz23/Δx23) of the second magnetic field components (e.g. Bz1, Bz2, Bz3) along the first direction, (also referred to herein as "out-of-plane gradients"); c) calculating a coarse signal (Sc) based on at least some or all of the first and second gradients; d) calculating a fine signal (Sf) based on at least some of the first and second gradients; e) determining a position (e.g. X, α) based on the coarse signal (Sc) and the fine signal (Sf).

The present invention also provides: a position sensor system comprising such a position sensor device and a magnetic structure having a plurality of poles, wherein the position sensor device is movable relative to the magnetic structure, or vice versa.

The sensor system of the present invention makes use of a specific magnetic structure, where a distance between the poles is not constant, but varies. This magnetic structure generates a specific magnetic field, having specific properties. As far as is known to the inventors, such a magnetic structure and its properties are not known in the art.

Figure 3A:
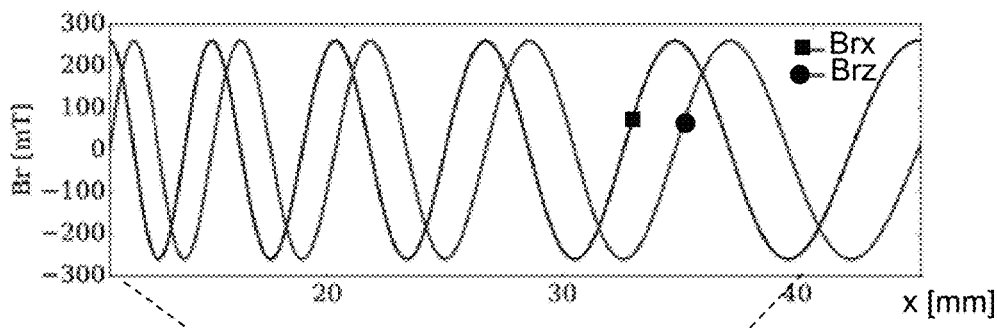
FIG. 3(a) to FIG. 3(h) show signals related to the exemplary linear position system of FIG. 1, illustrating some of the principles of the present invention.
Figure 3B:
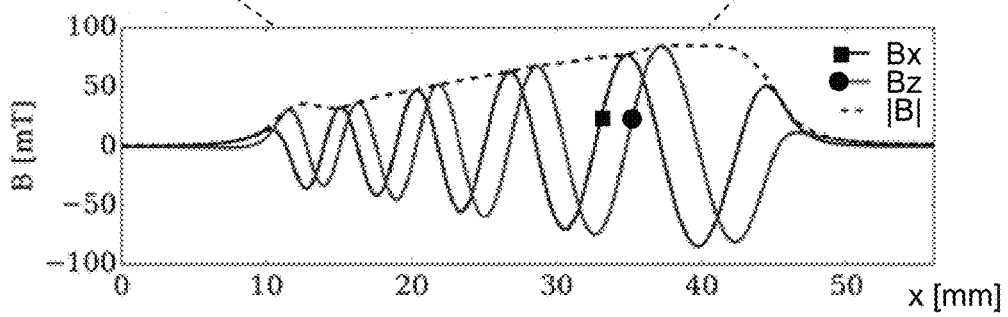

The present invention is at least partly based on the following insights (see e.g. FIGS. 3(a) to 3(h)):
(1) that the in-plane magnetic field component (Bx) and the out-of-plane magnetic field component (Bz) are substantially phase shifted over 90° (as shown in FIG. 3(a)), and
(2) that the magnitude |Bx| and |Bz| of these magnetic field components (Bx, Bz) increases as the distance between adjacent pole pairs increases, (as shown in FIG. 3(b)), (thus the sum of the squares of the two field components measured at a predefined distance from the magnet is not constant), and
(3) that the in-plane derivatives (i.e. d/dx) of these magnetic field components turns out to be substantially constant (see FIG. 3(c)), despite that the magnitude of the field components themselves increases (e.g. substantially linearly), because the distance between centres of the poles also increases and hence the spatial derivative remains largely constant, and
(4) that the ratio of the in-plane derivative (dBx/dx) and the out-of-plane derivative (dBz/dx) is substantially independent of the actual magnetic field strength, thus the fine signal (Sf) is substantially insensitive to demagnetization effects, and
(5) the fine signal is substantially independent of an external disturbance field, (in particular a constant disturbance field), because the fine signal is based on magnetic field gradients, and
(6) that it is possible to also derive a coarse signal Sc from the gradient signals, hence both the fine signal "Sf" as well as the coarse signal "Sc" are substantially independent of an external disturbance field.

The combination of these features provides unique properties to the position sensor system of being highly accurate (fine positioning), having a large measurement range (despite the high accuracy), being robust against an external disturbance field, and being robust against demagnetization.

In existing solutions, often a trade-off needs to be made between accuracy and range (for example as described in WO2014029885A1, where the maximum range of some embodiments is reduced to 360°/N).

FIG. 1 is a schematic block-diagram of an exemplary linear position sensor system 100 according to an embodiment of the present invention.

It is a linear position sensor system, comprising a sensor device 102 in the form of an integrated chip, which is movable relative to a magnetic structure 101, meaning that the magnetic structure 101 may be fixed while the sensor device 102 is movable, or that the sensor device 102 is fixed while the magnetic structure 101 is movable, or both the sensor device 102 and the magnetic structure 101 are movable.

The invention will be further described assuming that the magnetic structure 101 is fixed, and the sensor device 102 is movable to simplify the discussion, but the present invention is not limited thereto.

The sensor device 102 of FIG. 1 is arranged at a substantially constant distance H from the magnetic structure 101 in the Z-direction, perpendicular to the sensor plane, for example in the order of about 0.5 to about 5.0 mm, and can be moved in the X-direction, substantially parallel to a surface of the magnetic structure, hence maintaining a constant distance "H" from the magnetic structure 101.

The magnetic structure 101 comprises a magnetic material which is magnetised in a particular manner. What is shown is a vertical cross-section of the magnetic structure, and the arrows show that the remanent magnetic field inside the magnetic material is oriented either in the positive Z-direction, or the negative Z-direction, hence perpendicular to the direction of movement X.

One of the underlying ideas of the present invention is that the magnetic structure 101 has a plurality of magnetic poles P1, P2, P3, etc. which are not located equidistantly, but the distances between centers of adjacent poles vary. Preferably the distances vary strict monotonically, implying inter alia that all distances are different.

In the example of FIG. 1, the magnetic structure 101 has 10 magnetic poles P1 . . . P10, but of course the present invention is not limited thereto, and a larger or smaller number of poles can also be used, for example any number in the range from 3 to 50, or from 4 to 50, or from 5 to 50, or any number in the range from 3 to 30, or any number in the range from 4 to 20.

In the example of FIG. 1, the distance d1 between the first pole P1 and the second pole P2 is smaller than the distance d2 between the second pole P2 and the third pole P3, etc. In the example of FIG. 1, the distance monotonically increases from the left of FIG. 1 to the right of FIG. 1, meaning that d1<d2<d3< . . . <d9. The inventors found that based on the signals which can be measured by the sensor device 102, the position of the sensor device 102 on the X-axis can be uniquely determined, and with high accuracy (e.g. with a higher accuracy than would be possible if the magnetic structure 101 would contain only two or only three or only four equidistant poles), as will be explained further, when discussing FIGS. 3(a) to 3(h). In addition, the sensor device of the present invention has a reduced sensitivity to an external disturbance field (if present), or stated in other words, has an improved robustness to an external disturbance field (if present).

Without limiting the invention thereto, in preferred embodiments the distance d[i+1] may be chosen to be substantially equal to the distance d[i] multiplied by a factor F chosen in the range from about 103% to 200%, depending on the application. The factor F may be constant over the entire length of the magnetic structure 101, but that is not absolutely required.

In other embodiments, the factor F may vary for each pair, or for some of the pairs.

In the specific example shown in FIG. 1, the factor F is constant and about equal to 111%, but other values could also be used, for example approximately 103% or approximately 104% or approximately 105% or approximately 106% or approximately 107% or approximately 108% or approximately 109% or approximately 110% or approximately 111% or approximately 112% or approximately 114% or approximately 116% or approximately 118% or approximately 120% or approximately 125% or approximately 130% or approximately 135% or approximately 140% or approximately 145% or approximately 150% or approximately 160% or approximately 170% or approximately 180% or approximately 190% or approximately 200%. The impact hereof will become clear when discussing FIGS. 3(a) to 3(h).

While the distance d9 of the magnetic structure shown in FIG. 1 is about 2.3 times larger than the distance d1, this is only an example, and another ratio dmax/dmin between the maximum distance "dmax" and minimum distance "dmin" can also be chosen, for example but without limiting the present invention thereto, any ratio in the range from about 110% to about 800%, or a ratio in the range from about 150% to about 400%.

In other embodiments, the distances d[i] vary linearly with the pole number or vary quadratically with the pole number.

In a variant of FIG. 1, the magnetic material is magnetised substantially in the movement direction (e.g. in the direction of the longitudinal axis X), e.g. the positive X-axis or the negative X-axis.

Figure 2A:
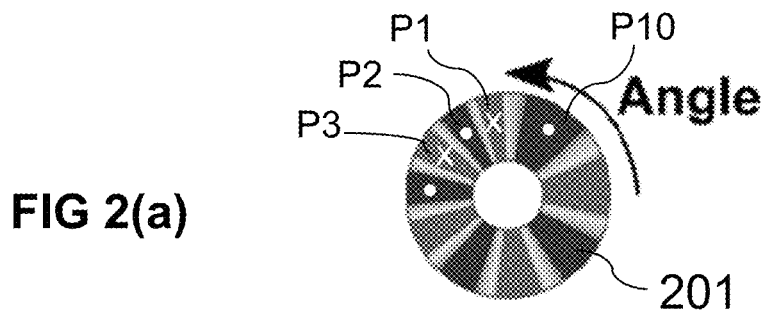
FIGS. 2(a) and 2(b) are a schematic block-diagram of an exemplary angular position sensor system according to an embodiment of the present invention.
Figure 2B:
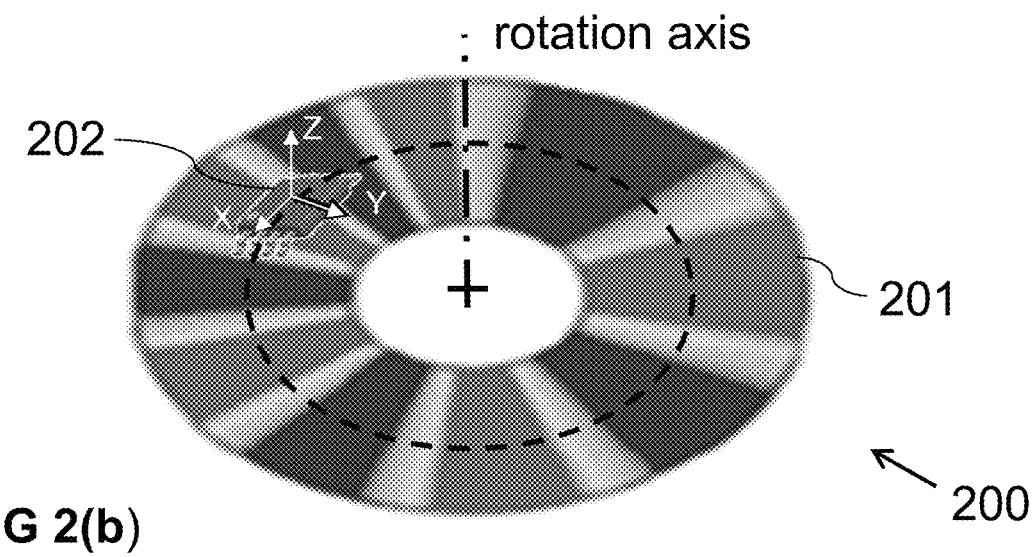

FIGS. 2(a) and 2(b) are a schematic block-diagram of an exemplary angular position sensor system 200 according to an embodiment of the present invention.

The same principles as described above are also applicable here, mutatis mutandis, meaning inter alia that "linear distance" needs to be converted into "angular distance", and "shift over the linear X-axis" needs to be converted into "rotation about the Z axis", etc.

One of the underlying ideas of the present invention applied to this embodiment is that the magnetic structure 201 has a plurality of magnetic poles P1, P2, . . . P10, which poles P1, P2, . . . are not located equidistantly, but the angular distances $\alpha 1$, $\alpha 2$, . . . between centres of adjacent poles vary, such that $\alpha 1 < \alpha 2 < \ldots < \alpha 9$ (see also FIG. 9). The structure may be axially magnetized, or the magnetization may be in-plane (e.g. oriented radially, or oriented tangentially), or the structure may be isotropically magnetized in the Z-direction.

The inventors found that based on the magnetic signals which can be measured by the sensor device 202, the angular position $\alpha$ of the sensor device 202 with respect to a reference position of the magnetic structure 201 can be uniquely determined, and with high accuracy (e.g. larger than would be possible if the magnetic structure would contain only three or only four poles), and in a manner which is highly robust against an external disturbance field.

The same or similar remarks with respect to the multiplication factor F (e.g. being a value in the range from about 103% to about 200%) and to the ratio dmax/dmin (representing an angular distance in this example) are also applicable here.

But the distances between centers of the magnetic poles may also vary in another monotonically increasing manner, for example, linearly or quadratically (with the pole number).

In FIGS. 2(a) and 2(b), the coordinate system with the three orthogonal X, Y, Z axes is attached to the sensor device, and the Z-axis is oriented parallel to the rotation axis of the magnet, and the X-axis is oriented tangential to the imaginary circle shown in dotted line, which is the direction of movement. The X-Y plane is parallel to the substrate of the sensor device. The Z-axis is orthogonal to said substrate. This is the case in all embodiments of the present invention, unless explicitly mentioned otherwise.

FIG. 3(a) to FIG. 3(h) show signals related to the exemplary linear position system of FIG. 1, illustrating some of the principles of the present invention.

FIG. 3(a) shows the remanent magnetic field Brx, Brz inside the magnetic material. It is noted that the remanent magnetization can be along Brz and Brx, or along Brz only, or along Brx only.

FIG. 3(b) shows the magnetic field components Bx (indicated by a black square), Bz (indicated by a black circle) at a predefined distance "H" outside of the magnetic material, as can be measured by the sensor device 102. The drawing also shows (in dotted line) the value |B| which is calculated here as:

$$|B| = \text{sqrt}(Bx*Bx + Bz*Bz) \qquad [1]$$

As can be seen, the value |B| is a relatively smooth signal which (at least over a portion of the measurement range) monotonically increases with X (although that is not absolutely required for the present invention to work). It was found that if the centres of the poles are located further apart, the magnetic field strength measured by the sensor device (at a relatively small constant distance H) increases.

Figure 3C:
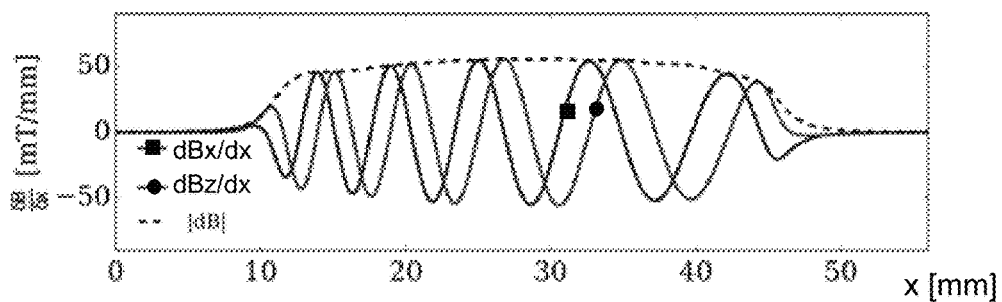

The inventors came to the idea of determining the spatial gradients of these signals in the X-direction. FIG. 3(c) shows the spatial derivative dBx/dx of the in-plane field component Bx (indicated by a black square) and shows the spatial derivative dBz/dx of the out-of-plane magnetic field component Bz (indicated by a black circle).

While not required for the present invention, FIG. 3(c) also shows (in dotted line) the value |dB| which is calculated here as:

$$|dB| = \text{sqrt}(dBx/dx*dBx/x + dBz/dx*dBz/dx) \qquad [2]$$

As can be seen, the value |dB| is also a relatively smooth signal which (at least over a portion of the measurement range) is substantially constant (although that is not absolutely required for the present invention to work).

The inventors came to the idea of calculating a signal "Sf" as a function of the field gradients dBx/dx and dBz/dx, more particularly, as the function:

$$Sf = \text{Arctan2}(dBx/dx, dBz/dx) \qquad [3]$$

(the function arctan 2 is also known as the atan2-function. The reader not familiar with this function can find more information, for example on "https://en.wikipedia.org/wiki/Atan2")

Figure 3D:
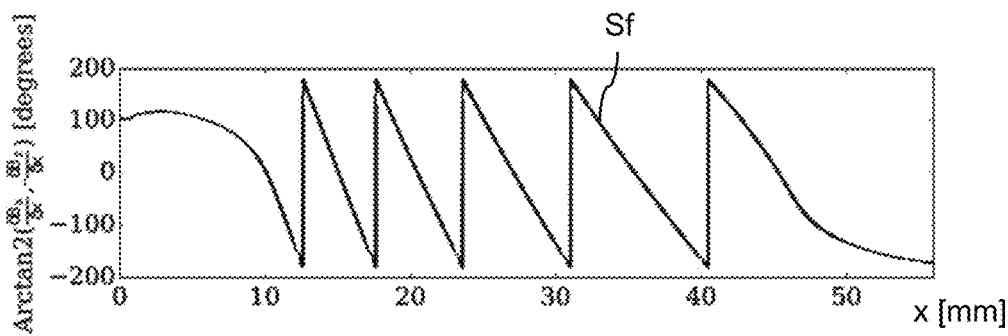

As can be appreciated from FIG. 3(d), the signal Sf looks like a "sawtooth-function", but with non-constant teeth. This signal can be used as a fine indicator (within each tooth) for the position X of the sensor device 102, but as can be seen, the range of each tooth is only a subrange of the total range.

As illustrated in FIGS. 4(a) and 4(b) and FIGS. 5(a) and 5(b), the signal "Sf" can be generated based on the signals Bx1 and Bz1 obtained from a first sensor S1 located at position X1, and from the signals Bx2 and Bz2 obtained from a second sensor S2 located at a position X2.

The inventors came to the idea of adding a third sensor S3 at position X3, and of determining a second gradient from the signals obtained from the second sensor S2 and the signals obtained from the third sensor S3. When calculating the formula [3] again, but now based on the signals from the second and third sensor, another saw-tooth function Sf2 is obtained, which can be expressed mathematically as:

$$Sf2 = \text{Arctan2}(\Delta Bx23/\Delta x23, \Delta Bz23/\Delta x23) \qquad [4]$$

where ΔBx23=(Bx3−Bx2), and ΔBz23=(Bz3−Bz2),
where Bx2, Bx3 is the in-plane field component obtained from the 2nd and 3rd sensor respectively, and Bz2, Bz3 is the out-of-plane field component obtained from the 2nd and 3rd sensor respectively.

Figure 3E:
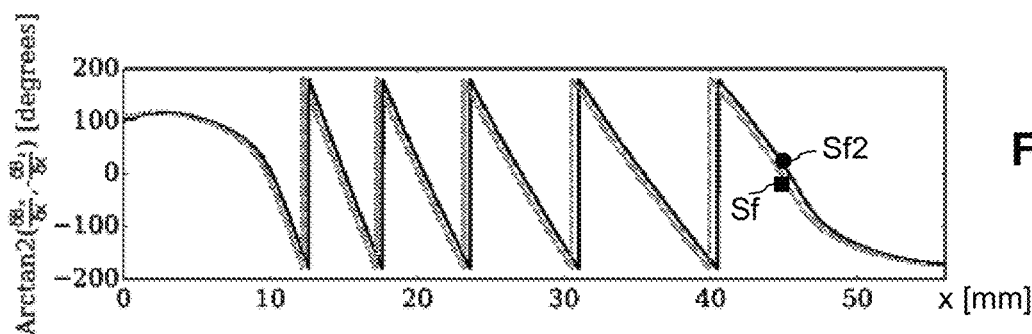

FIG. 3(e) shows the two saw-tooth function Sf and Sf2 in a single plot. As can be appreciated, the waveform of Sf2 very much resembles the waveform of Sf, but is slightly shifted over the X-axis.

Figure 3F:
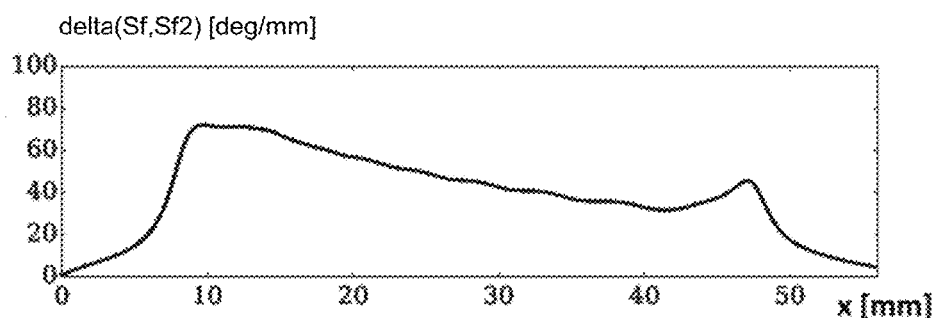

The inventors further came to the idea of subtracting Sf and Sf2, yielding the waveform shown in FIG. 3(f). Or more precisely, FIG. 3(f) shows a function referred to herein as "delta(Sf,Sf2)" defined as:

$$\text{delta}(Sf,Sf2)=Sf-Sf2+n*360° \qquad [5]$$

where n is an integer chosen such that delta lies in the range from 0° to 360° (including 0°, but excluding 360°). As can be seen, this function substantially monotonically decreases in the range of interest from about 10 to about 40 mm, and the inventors came to the idea of using this function as the coarse signal Sc.

FIG. 3(f) shows the inverse of this function 1/delta(Sf, Sf2), which substantially monotonically increases in the range of interest, and the inventors realised that this function can also be used as the coarse signal Sc. The inverse signal is slightly more linear and may provide slightly better results. The skilled person having the benefit of the present disclosure will understand that other signals derived from the delta-function can also be used, for example Sc=A*delta, or Sc=A/delta, where A is a predefined constant.

By combining the coarse signal Sc and the fine signal Sf, a unique position X of the sensor device 102 can be defined on the X-axis, with large accuracy. Moreover, since the signals Sf and Sc are both based on gradient signals, the (e.g. linear or angular) position thus determined is highly insensitive to an external disturbance field (if present).

The following example will explain how the unique position may be determined, without limiting the present invention to this example, or even to this method, as other methods may also be used. Referring to FIG. 3(h), suppose that the value Sf yields the value 50°, and suppose that the function Sc yields the value 0.017. As indicated in FIG. 3(h), there are multiple possible positions (one on each sawtooth) having the value Sf=50°. Consider for example three candidates xA, xB, xC associated with the point "A" (white circle) and point "B" (white triangle) and the point "C" (white square). The function Sc=0.017 can then be used to determine which of these candidates is the most likely candidate. In the example shown, the point "a" (black circle) corresponds to Sc=0.012, point "b" (black triangle) corresponds to 0.017, and point "c" (black square) corresponds to Sc=0.020. In this example, the point B is thus the most likely one, because the Sc-value of point "b" deviates the least.

The values of Sc for a plurality of positions may be determined during calibration, and may for example be stored in a non-volatile memory, or may be stored as a piecewise linear function, or in any other suitable way.

Since the signal Sc is based on magnetic field gradients, it should (ideally) be completely insensitive to a constant external magnetic disturbance field, because the gradient cancels out a constant field. It can be appreciated however, that this sensor system also has a reduced sensitivity to a non-constant external disturbance field, because after cancellation of the constant portion of the external disturbance field, only second order effects remain.

Thus, in practice, the value Sc (determined during actual use of the device) may slightly differ from the stored (or interpolated) value Sc (determined during calibration), but it can be appreciated that the external disturbances need to be quite high before the algorithm described above "selects the wrong tooth". Hence, the algorithm described above is highly robust against an external disturbance field. The tolerance margin can be appreciated to be equal to about half the step ε. Thus, the larger the step ε, the more tolerant the sensor system is against an external disturbance field. As long as the actual external disturbance is smaller than this tolerance margin, the sensor device provides a correct and highly accurate unique position over a relatively large range (in the example spanning multiple poles).

As can be appreciated from FIG. 3(h), the signals on the left end of the magnetic structure and on the right end of the magnetic structure cannot be used, but in practice the skilled person can make the magnetic structure slightly larger than the range to be measured.

Figure 3G:
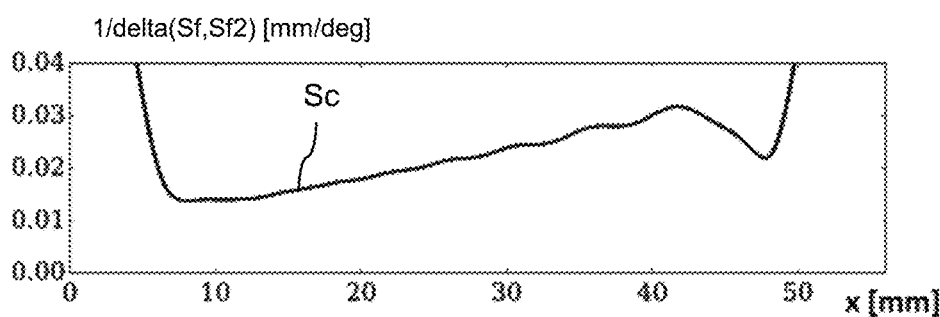
Figure 3H:
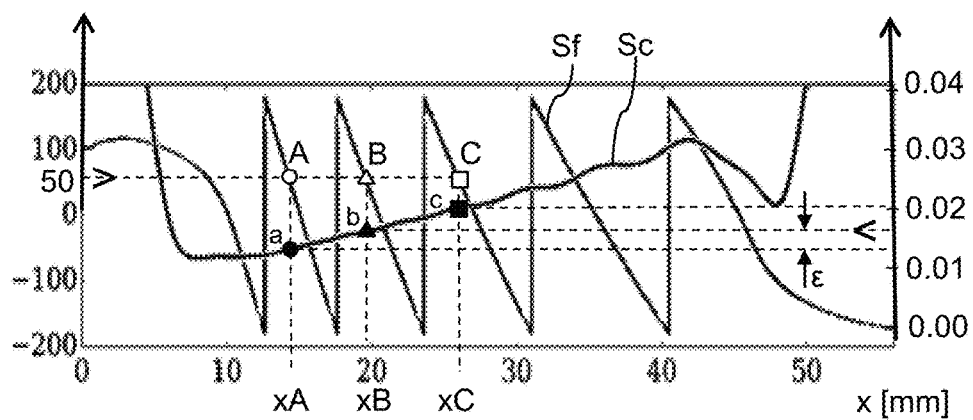

It is noted that, in the example above, the coarse signal Sc was chosen equal to the inverse delta function shown in FIG. 3(g), but the present invention is not limited thereto, and for example the delta-function itself, shown in FIG. 3(f) can also be used as the coarse signal Sc.

For completeness, it is noted that the invention will still work, even if the coarse signal Sc (see FIG. 3(f) or FIG. 3(g)) in the range from about 10 to about 40 mm) does not monotonically increase or monotonically decrease, but e.g. has a constant portion, or even has a local dip, as long as the combination of the two signals Sf and Sc is unique for each position on the X-axis.

The inventors also found that, if the amplitude of the first and second gradient signal is not the same, one of the gradients is preferably multiplied by a factor K before determining the arctangent function. The factor K can thus be a predefined constant equal to 1.0, or can be a predefined constant different from 1.0, e.g. smaller than 0.95 or larger than 1.05. In some embodiments, the factor K can also be determined using a predefined function K(T) of temperature. The value of K, or values or parameters of the predefined function K(T) can be stored in a non-volatile memory.

The inventors also found that the fine signal "Sf" can be calculated based on a second order gradient, which can be calculated as a difference between first order gradients, for example as follows, assuming the sensors S1, S2, S3 are spaced equidistantly:

$$\Delta^2 Bx/\Delta x^2=(\Delta Bx23/\Delta x)-(\Delta Bx12/\Delta x) \qquad [8a]$$

$$\Delta^2 Bz/\Delta x^2=(\Delta Bz23/\Delta x)-(\Delta Bz12/\Delta x) \qquad [8b]$$

$$Sf=\arctan 2(\Delta^2 Bx/\Delta x^2, \Delta^2 Bz/\Delta x^2) \qquad [8c]$$

Figure 4A:
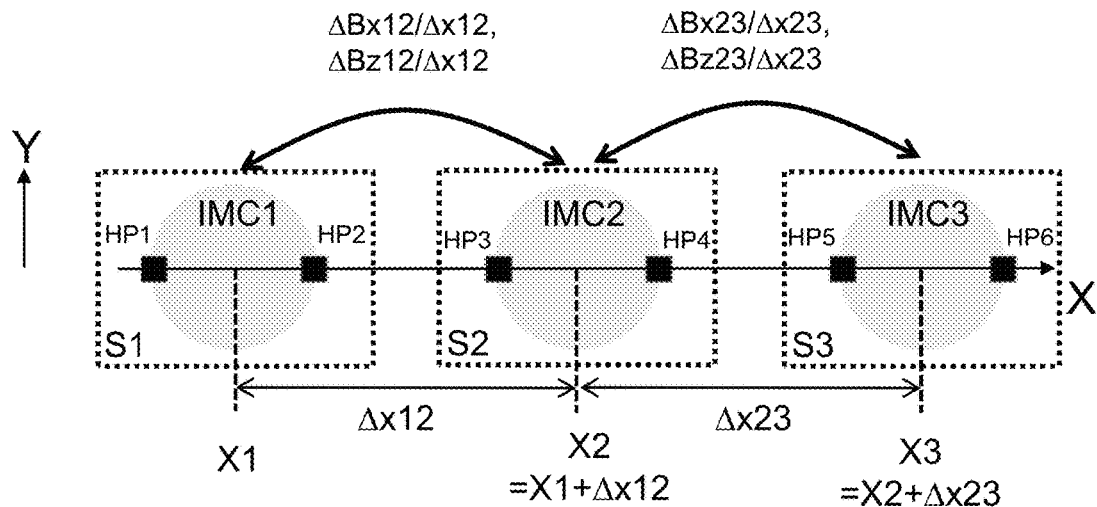
FIGS. 4(a) and 4(b) are a schematic block-diagram showing exemplary arrangements of sensor elements as can be used in a sensor device according to an embodiment of the present invention, which sensor device can be used in the linear position sensor system of FIG. 1 and/or in the angular position sensor system of FIGS. 2(a) and 2(b). The sensor device of FIG. 4(a) contains three collinear sensors, the sensor device of FIG. 4(b) contains four collinear sensors. Each of these sensors contains a pair of horizontal Hall elements arranged on opposite sides of an IMC element.
Figure 4B:
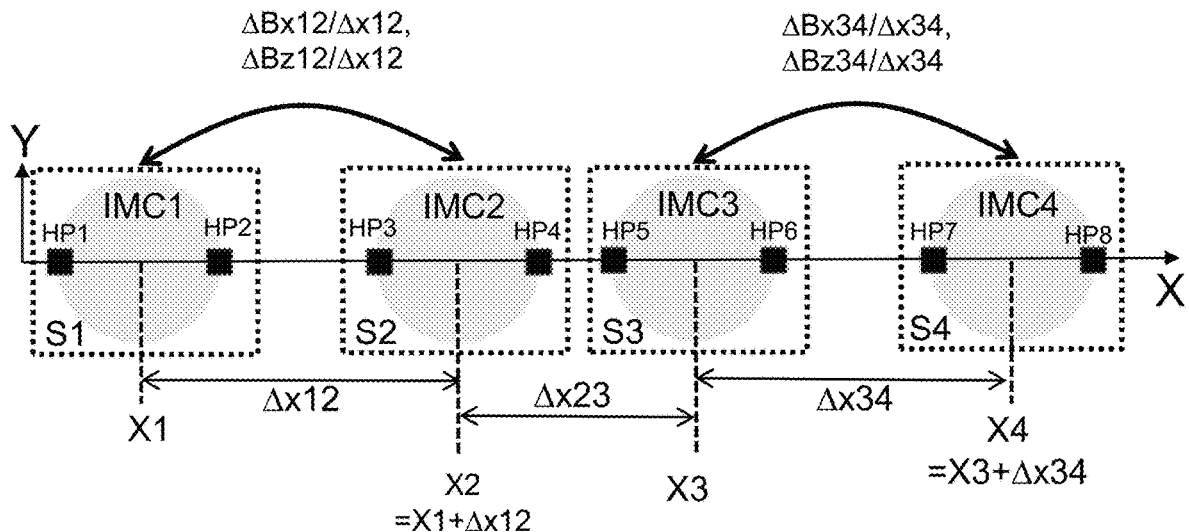

FIGS. 4(a) and 4(b) are a schematic block-diagram showing exemplary arrangements of sensor elements as can be used in a sensor device according to an embodiment of the present invention, which sensor device can be used in the linear position sensor system of FIG. 1 and/or in the angular position sensor system of FIGS. 2(a) and 2(b). The sensor device of FIG. 4(a) contains three collinear sensors S1, S2, S3. The sensor device of FIG. 4(b) contains four collinear sensors S1, S2, S3, S4.

Each sensor contains a pair of horizontal Hall elements (indicated by black squares) arranged on opposite sides of an integrated magnetic concentrator (IMC) element (indicated by gray circles). As is known in the art (e.g. from WO2014029885A1), such structures can be used to determine (e.g. measure and/or calculate) an in-plane magnetic field component Bx in the X-direction, (i.e. the direction of an imaginary line passing through the Horizontal Hall elements), and an out-of-plane magnetic field component Bz (in a direction perpendicular to the sensor plane).

In FIG. 4(a), the distance between the first and second sensor S1, S2 is ΔX12, and the distance between S2 and S3 is ΔX23. Preferably the distance between S1 and S2 is equal to the distance between S2 and S3, but that is not absolutely required, because a gradient can be calculated as (or proportional to) ΔB/Δx. If the distances are identical, the gradient can be calculated as (or proportional to) ΔB. If the distances are not equal, appropriate scaling can be used.

More in particular, if the signal provided by the first, second, third, fourth Hall element is HP1, HP2, HP3 and HP4 respectively,
the value of Bx at position X1 can be calculated as:

$$Bx1 = HP1 - HP2 \quad [6.1],$$

and the value Bz at position X1 can be calculated as:

$$Bz1 = HP1 + HP2 \quad [6.2],$$

and the value of Bx at position X2=X1+ΔX12 can be calculated as:

$$Bx2 = HP3 - HP4 \quad [6.3],$$

and the value of Bz at position X2=X1+ΔX12 can be calculated as:

$$Bz2 = HP3 + HP4 \quad [6.4]$$

From these magnetic field values Bx1, Bz1, Bx2, Bz2, which are measured directly or indirectly, other values can be calculated, for example one or more of the following:
an in-plane field gradient at X1:

$$dBx(X1) = (Bx2 - Bx1)/\Delta X12 = HP1 - HP2 + HP4 - HP3 \quad [6.5]$$

an out-of-plane field gradient at X1 (where the division by/ΔX is omitted, assuming ΔX12=ΔX23):

$$dBz(X1) = (Bz2 - Bz1)/\Delta X12 = HP1 + HP2 - HP3 - HP4 \quad [6.6]$$

a fine signal at X1:

$$Sf = \mathrm{Arctan2}(dBx(X1), dBz(X1)) \quad [6.7]$$

Similar formulas can be written for the calculation of the gradient at X2, based on the signals obtained from sensor S2 and S3:

$$Bx2 = HP3 - HP4 \quad [6.8],$$

$$Bz2 = HP3 + HP4 \quad [6.9],$$

$$Bx3 = HP5 - HP6 \quad [6.10],$$

$$Bz3 = HP5 + HP6 \quad [6.11]$$

in-plane field gradient at X2:

$$dBx(X2) = (Bx3 - Bx2)/\Delta X23 = HP3 - HP4 + HP6 - HP5 \quad [6.12]$$

out-of-plane field gradient at X2:

$$dBz(X2) = (Bz3 - Bz2)/\Delta X23 = HP3 + HP4 - HP5 - HP6 \quad [6.13]$$

a fine signal at X2:

$$Sf2 = \mathrm{Arctan2}(dBx(X2), dBz(X2)) \quad [6.14]$$

According to an aspect of the present invention, the coarse signal Sc can then be calculated, based on a difference between Sf and Sf2, for example based on the following formulas:

$$\mathrm{delta} = Sf - Sf2 + n \cdot 360° \quad [6.15]$$

where n is an integer chosen such that delta lies in the range from (and including) 0° to (but excluding) 360°, $$Sc = \mathrm{delta} \quad [6.16a]$$

$$\mathrm{or}\ Sc = 1/\mathrm{delta} \quad [6.16b]$$

The combination of Sc and Sf then yield a single value for X or α, as explained above.

It is noted that if ΔX12 is not equal to ΔX23, slightly different formulas may need to be used, but such details need not be explained in more detail here, and are well within the scope of the person skilled in the art of magnetic position sensors having the benefit of the present disclosure.

In FIG. 4(b), the distance between the first and second sensor S1, S2 is ΔX12, the distance between S2 and S3 is ΔX23, and the distance between S3 and S4 is ΔX34. Preferably the distance between S1 and S2 is equal to the distance between S3 and S4, but that is not absolutely required, for the same reason as mentioned above. The four sensors S1, S2, S3, S4 may be located equidistantly, but that is not required. The distance ΔX23 may be larger or smaller than ΔX12. In fact, sensor S3 may even be located between sensor S1 and sensor S2.

A similar set of formulas can be derived for this sensor device, mutatis mutandis. More specifically, formulas [6.1] to [6.7] are also applicable, but formulas [6.8 to 6.16] would be calculated based on the signals of sensor S3 and S4 rather than sensor S2 and sensor S3.

The same remarks about the factor K mentioned in FIGS. 3(a) to 3(h) are also applicable in FIGS. 4(a) and 4(b).

In the case of four sensors, the fine signal "Sf" can also be calculated based on a second order gradient, which can be calculated again as a difference between first order gradients. In this case the distance Δx12 between the sensors S1 and S2 is preferably the same as the distance Δx34 between the sensors S3 and S4. The distance Δx23 between S2 and S3 may also be the same as Δx12, but that is not absolutely required. The following formulas can be used in this case:

$$\Delta^2 Bx/\Delta x^2 = (\Delta Bx34/\Delta x) - (\Delta Bx12/\Delta x) \quad [9a]$$

$$\Delta^2 Bz/\Delta x^2 = (\Delta Bz34/\Delta x) - (\Delta Bz12/\Delta x) \quad [9b]$$

$$Sf = \mathrm{arctan}\,2(\Delta^2 Bx/\Delta x^2, \Delta^2 Bz/\Delta x^2) \quad [9c]$$

Figure 5A:
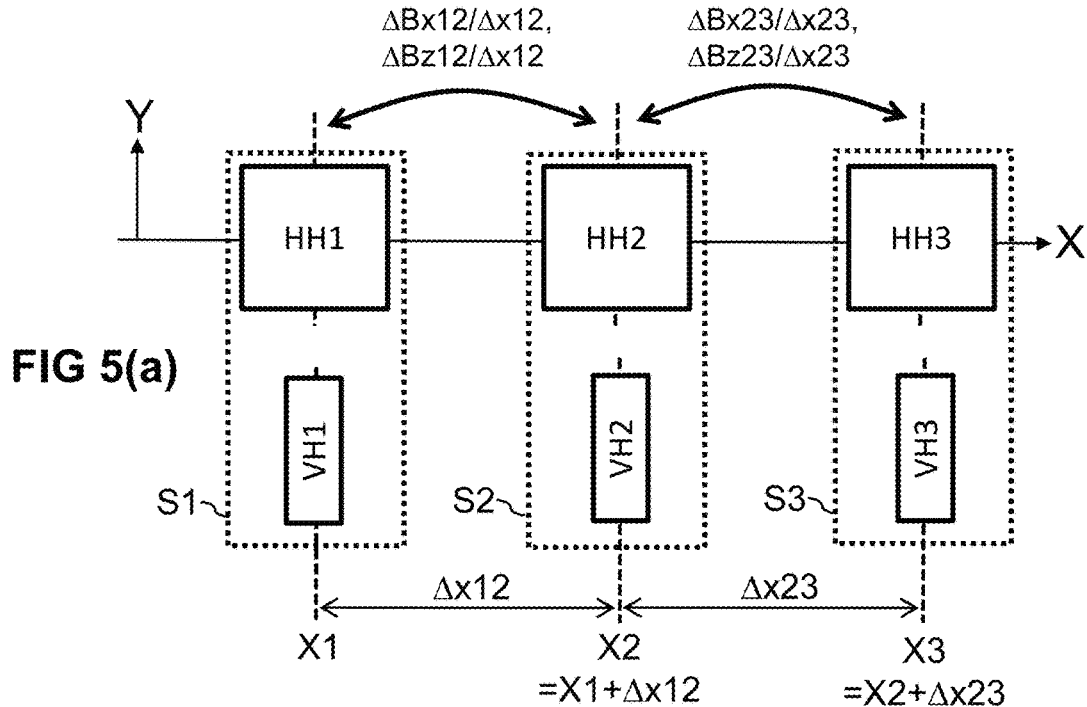
FIGS. 5(a) and 5(b) are a schematic block-diagram showing another exemplary arrangement of sensor elements as can be used in a sensor device according to an embodiment of the present invention, which sensor device can be used in the linear position sensor system of FIG. 1 and/or in the angular position sensor system of FIGS. 2(a) and 2(b). The sensor device of FIG. 5(a) contains three collinear sensors, the sensor device of FIG. 5(b) contains four collinear sensors. Each of these sensors contains a horizontal Hall element and a vertical Hall element.
Figure 5B:
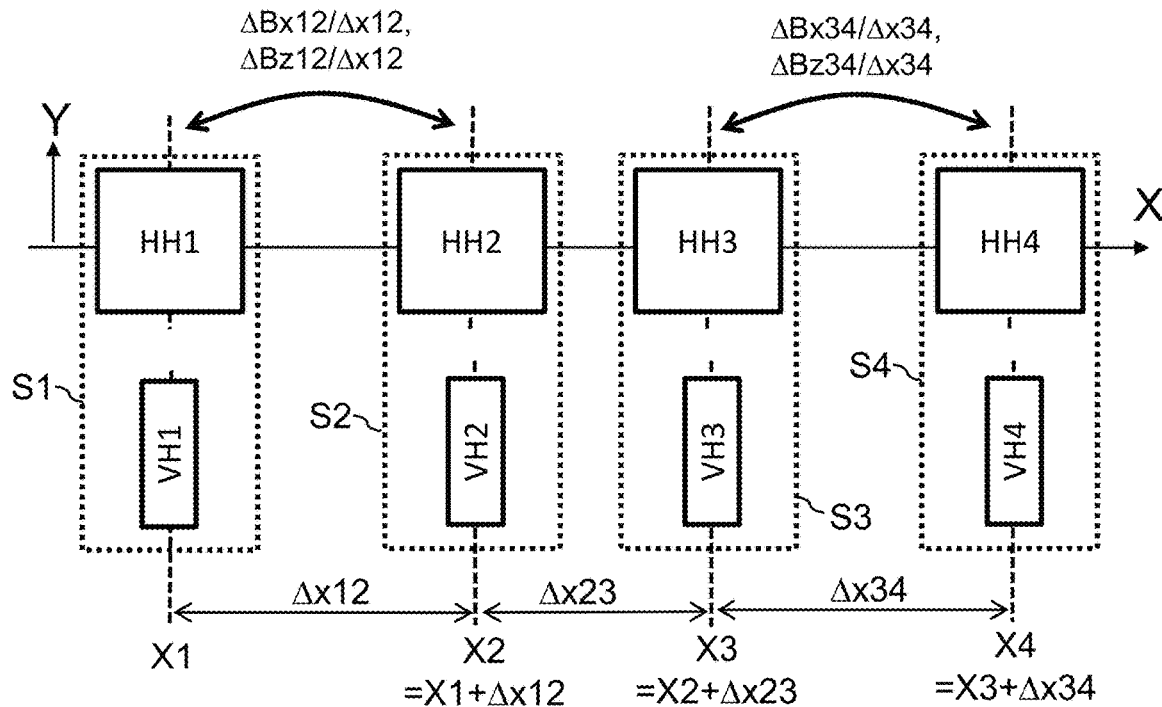

FIGS. 5(a) and 5(b) are a schematic block-diagram showing other exemplary arrangements of sensor elements as can be used in a sensor device according to an embodiment of the present invention, which sensor device can be used in the linear position sensor system 100 of FIG. 1 and/or in the angular position sensor system 200 of FIGS. 2(a) and 2(b). The sensor device of FIG. 5(a) contains three collinear sensors, the sensor device of FIG. 5(b) contains four collinear sensors. Each sensor contains a horizontal Hall element (indicated by a square) without IMC, and a vertical Hall element (indicated by a rectangle).

The horizontal Hall elements are adapted for measuring a magnetic field component Bz in the Z-direction, perpendicular to the sensor plane (e.g. semiconductor substrate). The vertical Hall elements are oriented so as to measure the Bx-component of the magnetic field, oriented in the X-direction, being the direction of movement, or a direction tangential to the movement trajectory (e.g. tangential to a circle in case of an angular position sensor).

In FIG. 5(a), the distance between the first and second sensor S1, S2 is ΔX12, and the distance between S2 and S3 is ΔX23. Preferably the distance between S1 and S2 is equal to the distance between S2 and S3, but that is not absolutely required, because a gradient can be calculated as (or proportional to) ΔB/Δx. If the distances are identical, the gradient can be calculated as (or proportional to) ΔB. In fact, the distance between the horizontal Hall elements does not need to be equal to the distance between the vertical Hall elements.

The sensor device shown in FIG. 5(a) can measure an in-plane field component Bx and an out-of-plane field component Bz at three different locations. More in particular, sensor S1 can measure Bx1 and Bz1 at position X1, sensor S2 can measure Bx2 and Bz2 at position X2, and sensor S3 can measure Bx3 and Bz3 at position X3.

More in particular, if the signal provided by the first, second and third horizontal Hall element is HH1, HH2, HH3 respectively, and the signal provided by the first, second and third vertical Hall element is VH1, VH2, VH3 respectively, the out-of plane magnetic field component at a first location X1 can be determined as:

$$Bz1=HH1 \quad [7.1]$$

The out-of plane magnetic field component at a second location X2 can be determined as:

$$Bz2=HH2 \quad [7.2]$$

From these values, an out-of-plane magnetic field gradient dBz at X1 can be calculated as:

$$dBz(X1)=HH1-HH2 \quad [7.3]$$

The in-plane magnetic field component at a first location X1 can be determined as:

$$Bx1=VH1 \quad [7.4]$$

The in-plane magnetic field component at a second location X2 can be determined as:

$$Bx2=VH2 \quad [7.5]$$

From these magnetic field values, an in-plane magnetic field gradient dBx at X1 can be calculated as:

$$dBx(X1)=VH1-VH2 \quad [7.6]$$

Similar as for FIGS. 4(a) and 4(b), based on these values, a fine signal Sf at X1, can be determined based on:

$$Sf=\text{Arctan2}(dBx(X1),dBz(X1)) \quad [7.7]$$

In a similar manner, a fine signal Sf2 can be calculated at X2, based on the signals obtained from S2 and S3, as follows:

$$Sf2=\text{Arctan2}(dBx(X2),dBz(X2)) \quad [7.8]$$

and a coarse signal can be defined, based on a difference between Sf and Sf2, for example based on:

$$\text{delta}=Sf-Sf2+n*360° \quad [7.9]$$

where n is an integer chosen such that delta lies in the range from (and including) 0° to (but excluding) 360°, $$Sc=\text{delta} \quad [7.10a]$$

$$\text{or } Sc=1/\text{delta} \quad [7.10b]$$

The combination of Sc and Sf then yield a single value for X or α, as explained above.

It is noted that if ΔX12 is not equal to ΔX23, slightly different formulas may need to be used, but such details need not be explained in more detail here, and are well within the scope of the person skilled in the art of magnetic position sensors having the benefit of the present disclosure.

In FIG. 5(b), the distance between the first and second sensor S1, S2 is ΔX12, the distance between S2 and S3 is ΔX23, and the distance between S3 and S4 is ΔX34. Preferably the distance between S1 and S2 is equal to the distance between S3 and S4, but that is not absolutely required, for the same reason as mentioned above. The four sensors S1, S2, S3, S4 may be located equidistantly, but that is not required. The distance ΔX23 may be larger or smaller than ΔX12. In fact, sensor S3 may even be located between sensor S1 and sensor S2.

A similar set of formulas can be derived for this sensor device, mutatis mutandis. More specifically, formulas [7.1] to [7.7] are also applicable, but formulas [7.8 to 7.10] would be calculated based on the signals of sensor S3 and S4 rather than sensor S2 and sensor S3.

Figure 6:
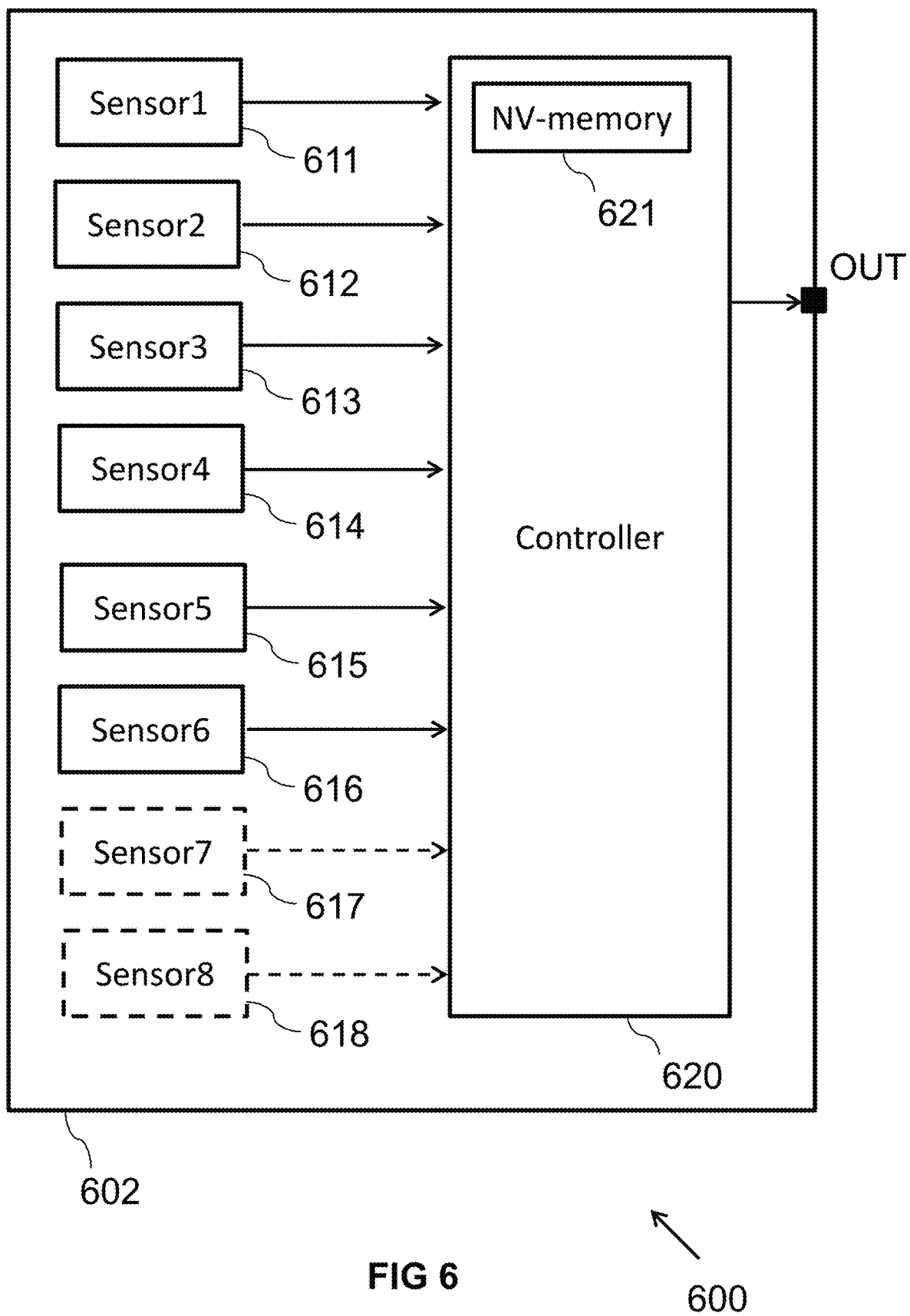
FIG. 6 shows a schematic block diagram of sensor devices according to embodiments of the present invention, as can be used in the position sensor system of FIG. 1 or FIGS. 2(a) and 2(b).

FIG. 6 shows a schematic block diagram of a sensor device 600, as can be used in the linear position sensor system 100 of FIG. 1, or the angular position sensor system 200 of FIGS. 2(a) and 2(b).

The position sensor device 600 comprises: a plurality of sensor elements 611-618 (e.g. Horizontal Hall elements and/or vertical Hall elements) allowing to determine at least three in-plane magnetic field components Bx1, Bx2 Bx3 and at least three out-of-plane magnetic field components Bz1, Bz2, Bz3 on at least three different locations X1, X2, X3 spaced apart over predefined distances, as shown for example in FIGS. 4(a) and 4(b) and FIGS. 5(a) and 5(b).

The position sensor device 600 further comprises a processing unit 620 adapted for calculating an in-plane field gradient dBx/dx (also denoted as dBx) and an out-of-plane field gradient dBz/dx (also denoted as dBz) at two different locations (X1 and X2 in FIG. 4(a) and FIG. 5(b); or at X1 and X3 in FIG. 4(b) and FIG. 5(b)), and for calculating a fine signal "Sf" and a coarse signal "Sc" based on these gradient signals, for example using one or more of the formulas [6.1] to [6.16], and [7.1] to [7.10].

The processing unit 620 is further adapted for determining said linear position X or said angular position α based on both the coarse signal Sc and on the fine signal Sf, for example as explained in FIG. 3(h), for example using a look-up table and interpolation, or in any other suitable way.

The processing unit 620 may comprise a programmable device, adapted for performing a method of determining said linear or angular position, as described above, or as will be described in FIG. 11.

In some embodiments, the position sensor device may further comprise a temperature sensor (not shown), connected to the processing unit 620, which can be used for calculating the value of K in embodiments where K is a function of temperature.

Figure 7:
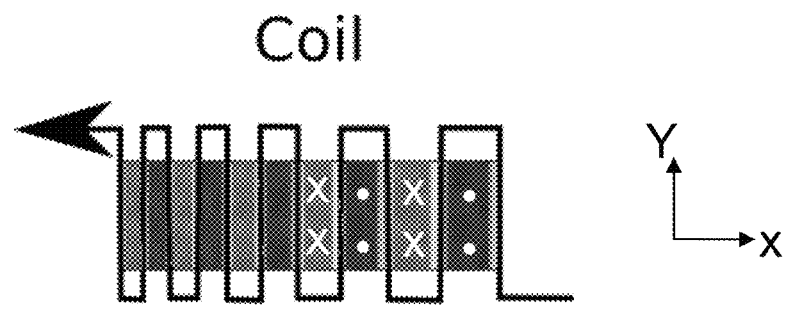
FIG. 7 illustrates a first method of producing a magnetic structure as may be used in the linear position sensor system of FIG. 1, based on magnetising a magnetic material using a (strong) current flowing through a conductor.

FIG. 7 illustrates a first method of producing a magnetic structure 701 as may be used in the linear position sensor system of FIG. 1. This method is based on magnetising a magnetic material using a relatively strong current (a technique known per sé in the art, but not for this particular topology). What is shown is a top view of a surface of a structure comprising magnetic material. At a small distance above the surface, an electrical conductor is positioned as shown, forming a zig-zag, and a relatively large current is injected through the conductor, inducing a large magnetic field, which enters the page of the drawing (indicated by x), and which comes out of the page of the drawing (indicated by •), only a few vectors are shown.

Figure 8:
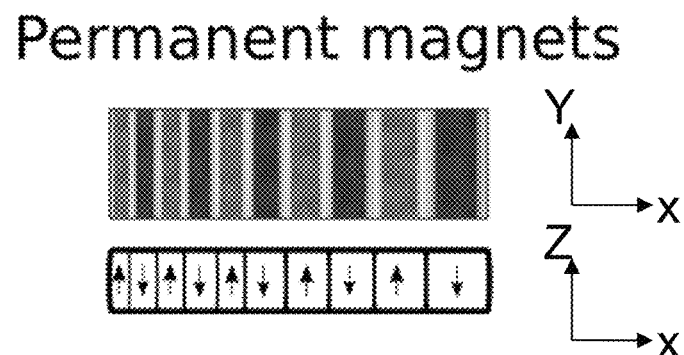
FIG. 8 illustrates a second method of producing a magnetic structure as may be used in the linear position sensor system of FIG. 1.

FIG. 8 illustrates a second method of producing a magnetic structure as may be used in the linear position sensor system of FIG. 1. Such a magnet structure can be produced for example by a technique for making bonded magnets. This technique is known per sé, albeit for equidistant magnet poles. Typically, a mixture known as "feed stock" containing magnetic particles is injected in a cavity of a mold, and one or more permanent magnets are located in close vicinity of, but outside the cavity during molding.

Figure 9:
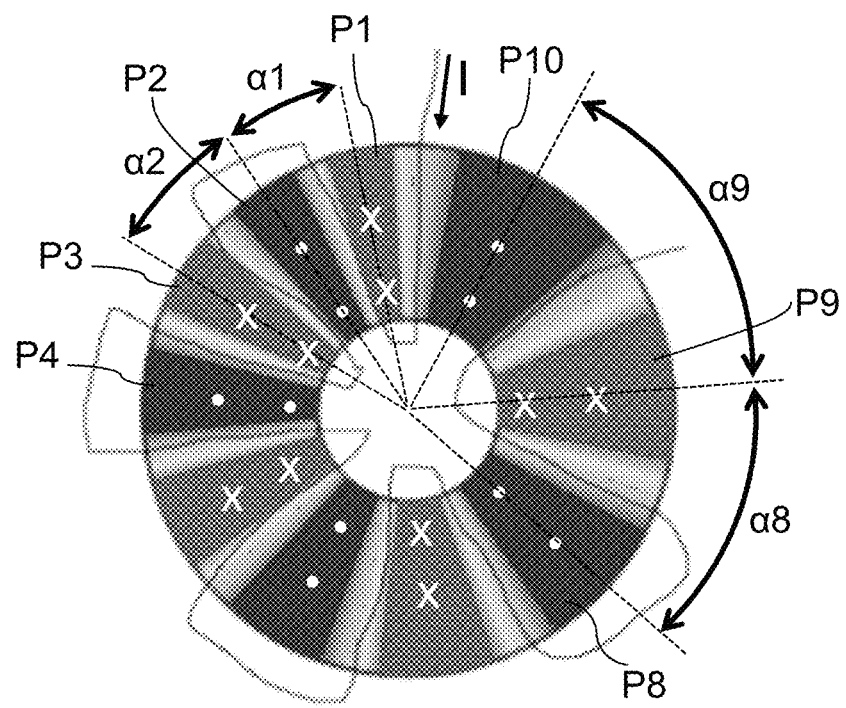
FIG. 9 illustrates a method of producing a magnetic structure as may be used in the angular position sensor system of FIGS. 2(a) and 2(b), based on magnetising a magnetic material using a (strong) current flowing through a conductor.

FIG. 9 illustrates a method of producing a magnetic structure as may be used in the angular position sensor system of FIGS. 2(a) and 2(b), based on magnetising a magnetic material. A similar technique as described in FIG. 7 is used here, mutatis mutandis. It is noted that in this drawing it is clearly shown that α1<α2<α3<...<α9. In this particular example, the number of poles (which can be seen by a sensor device facing one of the ring shaped surfaces, as illustrated in FIGS. 2(a) and 2(b)) is 10, and the ratio of α9/α1=about 2.63, and the multiplication factor F=α3/α2=α2/α1=about 1.13, but as described above, the present invention is not limited thereto, and a different number of poles and/or a different ratio between the first and second angular distance, and/or a different multiplication factor F may be used, or the angular distances may vary monotonically as a linear function of the pole number, or quadratically, or in any other suitable way.

Figure 10:
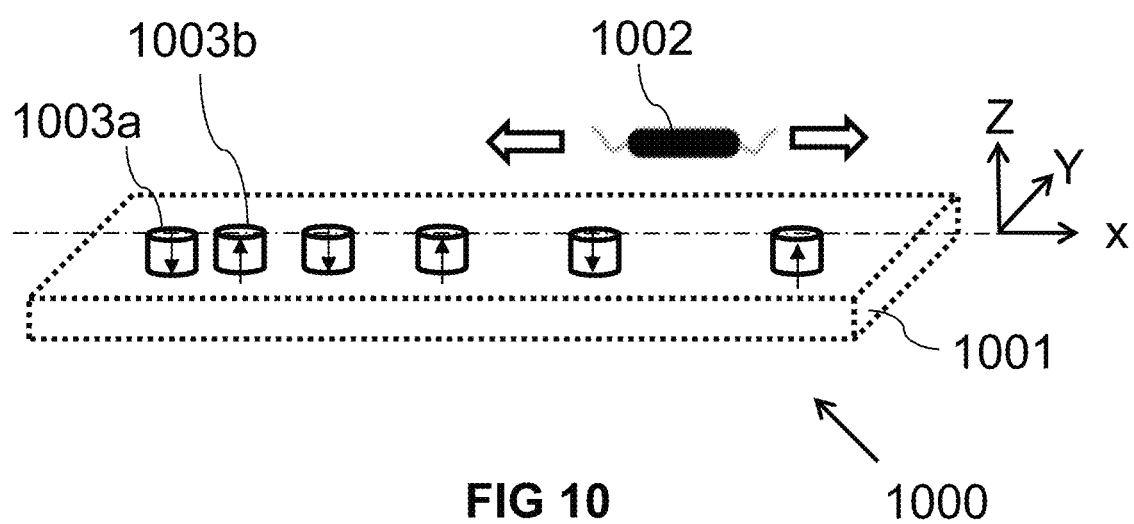
FIG. 10 illustrates yet another magnetic structure as may be used in the linear position sensor system of FIG. 1.

FIG. 10 illustrates yet another magnetic structure 1001 as may be used in the angular position sensor system of FIG. 1. The magnetic structure comprises a non-magnetic structure functioning as a holder, with a plurality of openings, and in each opening a permanent magnet is inserted. The magnets 1003a, 1003b, etc. can be axially magnetized, or the magnetization can also be in-plane or isotropic.

The same principles as explained above are also applicable here, mutatis mutandis. The magnets may be cylindrical magnets, but that is not absolutely required. The cylindrical magnets may have a single diameter (as shown), or may have different diameters (not shown). What is important is that the distance between the centers of the magnets varies.

Figure 11:
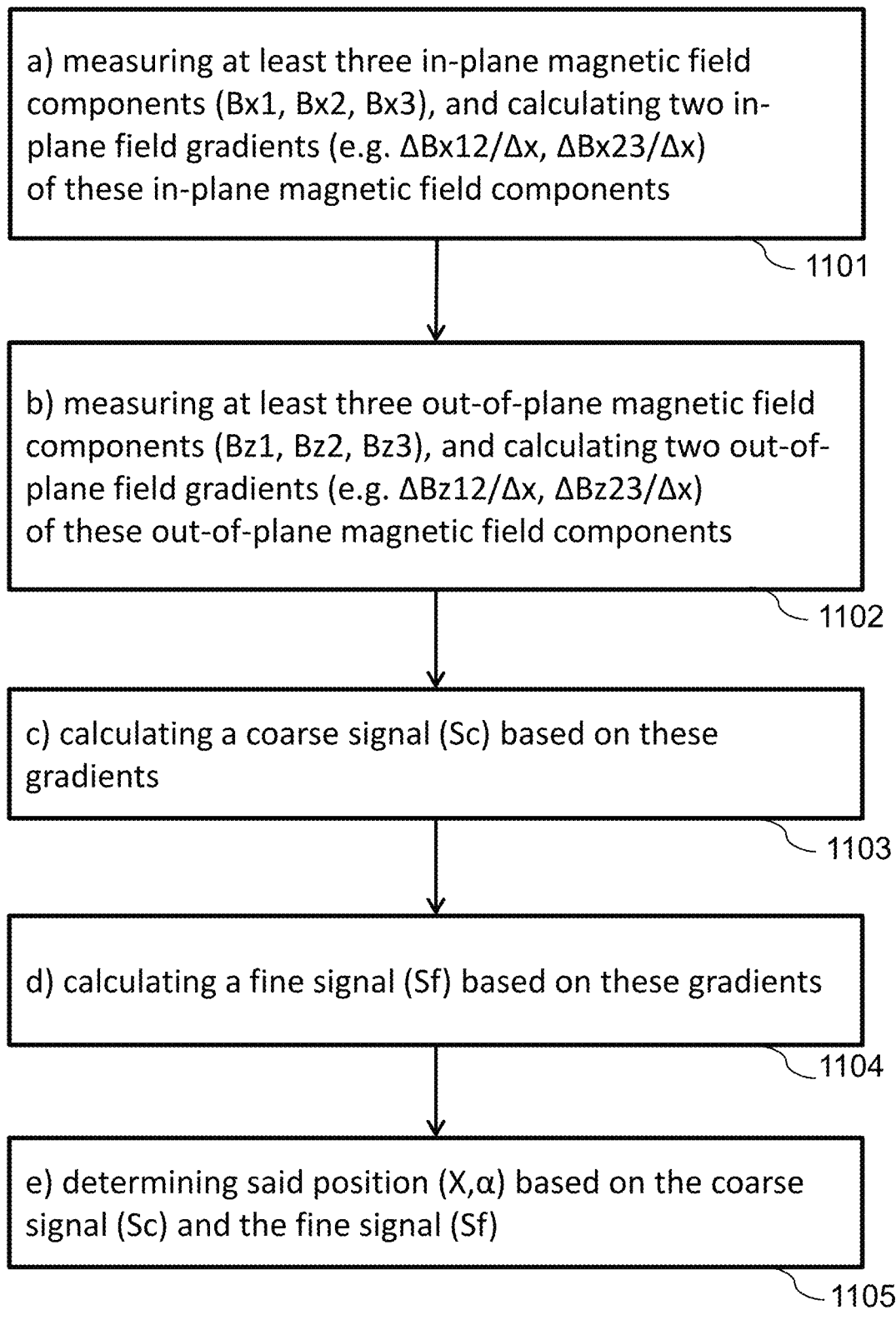
FIG. 11 illustrates a method of determining a position of a sensor device relative to a magnetic structure, according to embodiments of the present invention.

FIG. 11 illustrates a method 1100 of determining a position of a sensor device (see for example FIG. 6 with a sensor configuration of FIG. 4(a) or FIG. 4(b) or FIG. 5(a) or FIG. 5(b)) relative to a magnetic structure (see for example the magnetic structure of FIG. 1 or FIGS. 2(a) and 2(b) or FIG. 10) having a plurality of poles, and said sensor device comprising a plurality of magnetic sensors or sensor elements, and wherein the magnetic structure is movable (e.g. linearly or rotationally) relative to the sensor device or vice versa, and wherein a distance (Xpp, αpp) between centres of adjacent poles varies along a movement direction or along the movement trajectory.

The method comprises the steps of:
a) measuring 1101 at least three in-plane magnetic field components (Bx1, Bx2, Bx3), and calculating two in-plane magnetic field gradients (e.g. ΔBx12/Δx, ΔBx23/Δx) of these in-plane magnetic field components;
b) measuring 1102 at least three out-of-plane magnetic field components (Bz1, Bz2, Bz3), and calculating two out-of-plane magnetic field gradients (e.g. ΔBz12/Δx, ΔBz23/Δx);
c) calculating 1103 a coarse signal "Sc" based on these gradients;
d) calculating 1104 a fine signal "Sf" based on these gradients;
e) determining 1105 said position X, α based on the coarse signal "Sc" and the fine signal "Sf", for example using a look-up table and interpolation.

Figure 12A:
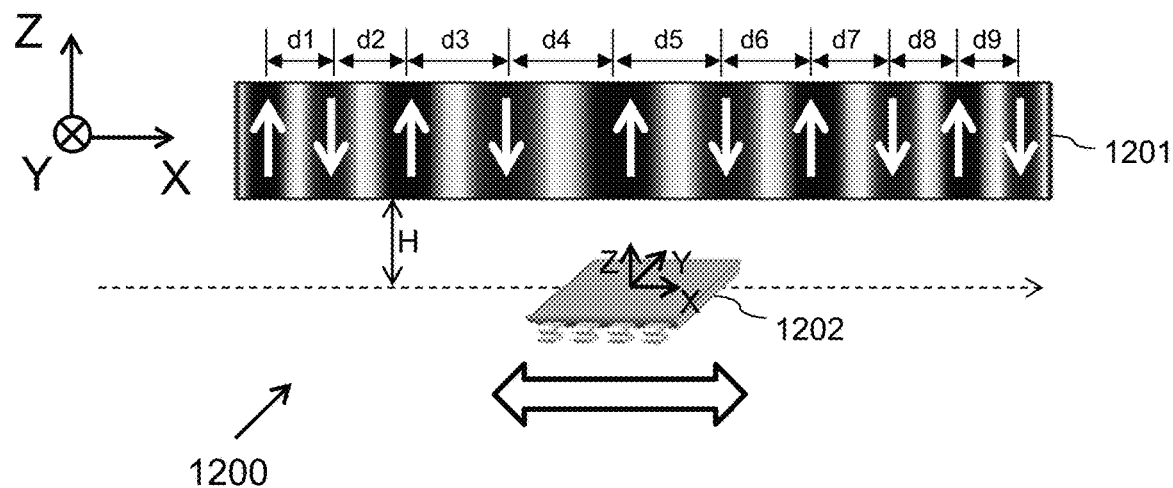
FIG. 12(a) shows a schematic block-diagram of another linear position sensor system according to an embodiment of the present invention, wherein the distances between adjacent poles of the magnetic structure increase in a first portion and decrease in a second portion of the magnetic structure, which can be seen as a variant of FIG. 1.

FIG. 12(a) shows a schematic block-diagram of another linear position sensor system 1200, which can be seen as a variant of FIG. 1. As can be seen in FIG. 12(a), the pole distances between centers of adjacent poles vary along the movement direction X of the sensor device, but in contrast to FIG. 1, the distances between the poles of the magnetic structure of FIGS. 12(a) and 12(b) do not increase or decrease monotonically from one end of the magnetic structure 1201 to the other end, but the distances increase over a first portion of the magnetic structure, and decrease over a second portion of the magnetic structure. In the particular example of FIG. 12(a), when considering the distances from the left end to the right end of the drawing, the distances first increase from d1 to d5, and then decrease from d6 to d9.

The magnetic field created by the magnetic structure 1201 of FIG. 12(a) will be different from that created by the magnetic structure 101 of FIG. 1, and the sensor device 1202 is adapted accordingly (e.g. by using a non-volatile memory holding different values or different coefficients of polynomials), as will be explained in more detail in FIG. 13(a) to FIG. 13(c). The main principles, however, remain the same, since the linear position is still calculated based on a coarse signal Sc and a fine signal Sf, and since the coarse signal Sc and the fine signal Sf are still derived from one or more gradient signals, for example from the gradient dBx/dx of the magnetic field component Bx along the X-direction and/or from the gradient dBz/dx of the magnetic field component Bz along the X-direction, the X-direction being the direction of relative movement, the Z-direction being perpendicular to X.

Figure 13A:
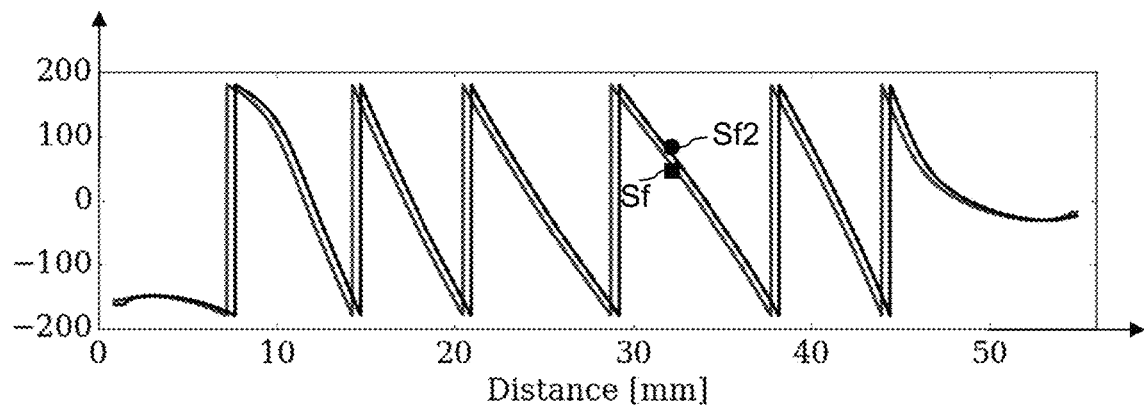
FIG. 13(a) to FIG. 13(c) show signals obtainable by the position sensor of FIG. 12(a), which can be seen as variants of the signals of FIG. 3(e) to FIG. 3(g).
Figure 13B:
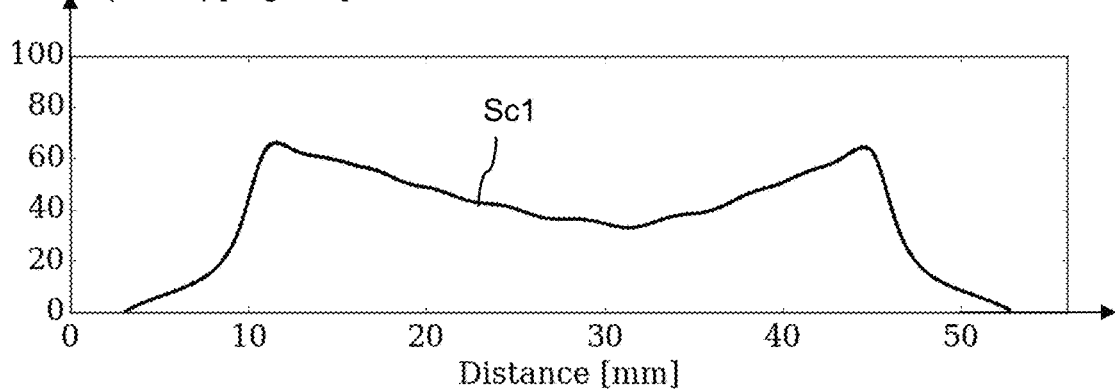
Figure 13C:
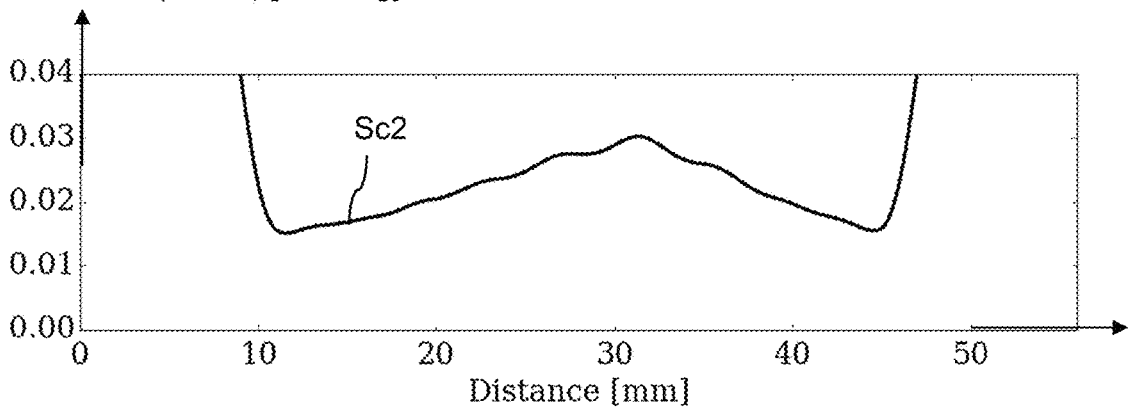

FIG. 13(a) to FIG. 13(c) show signals similar to those of FIG. 3(e) to FIG. 3(g), but for the magnet structure of FIG. 12(a). While the coarse signal of FIG. 3(g) may be preferred over the coarse signal of FIG. 3(f) because it results in a better defined intersection (more perpendicular) with respect to the fine signal curve, the slope of the coarse signal Sc1 of FIG. 13(b) and of the coarse signal Sc2 of FIG. 13(c) varies. Depending on the implementation, one or both of the coarse signals Sc1, Sc2 can be used.

In an embodiment, the signal Sc1 of FIG. 13(b) is used as the coarse signal, and the linear position is calculated based on one of the fine signals Sf1, Sf2 of FIG. 13(a) in combination with Sc1.

In another embodiment, the signal Sc2 of FIG. 13(c) is used as the coarse signal, and the linear position is calculated based on one of the fine signals Sf1, Sf2 of FIG. 13(a) in combination with Sc2.

Referring back to FIG. 12(a), the distances d1-d5 may increase according to a first factor F1 over said first portion and may decrease in accordance with a second factor F2, different from the first factor F1, over said second portion. As can be appreciated from FIG. 13(b) and FIG. 13(c), the effect hereof is that the coarse signals Sc1, Sc2 will have a different "slope" over the first and second portion, which may help to increase the probability that the combination of the Sc and Sf values are unique over the entire range. As already indicated above (when discussing FIG. 1), many values of Factor1 and Factor2 can be used, for example in the range from about 111% to about 800%, or from 111% to 400%. In fact, it is not required that the distances vary in a multiplicative way, although this is convenient for the understanding and the description. It suffices that the distances are different.

Preferably, the magnetic structure 1201 is asymmetric.

Figure 12B:
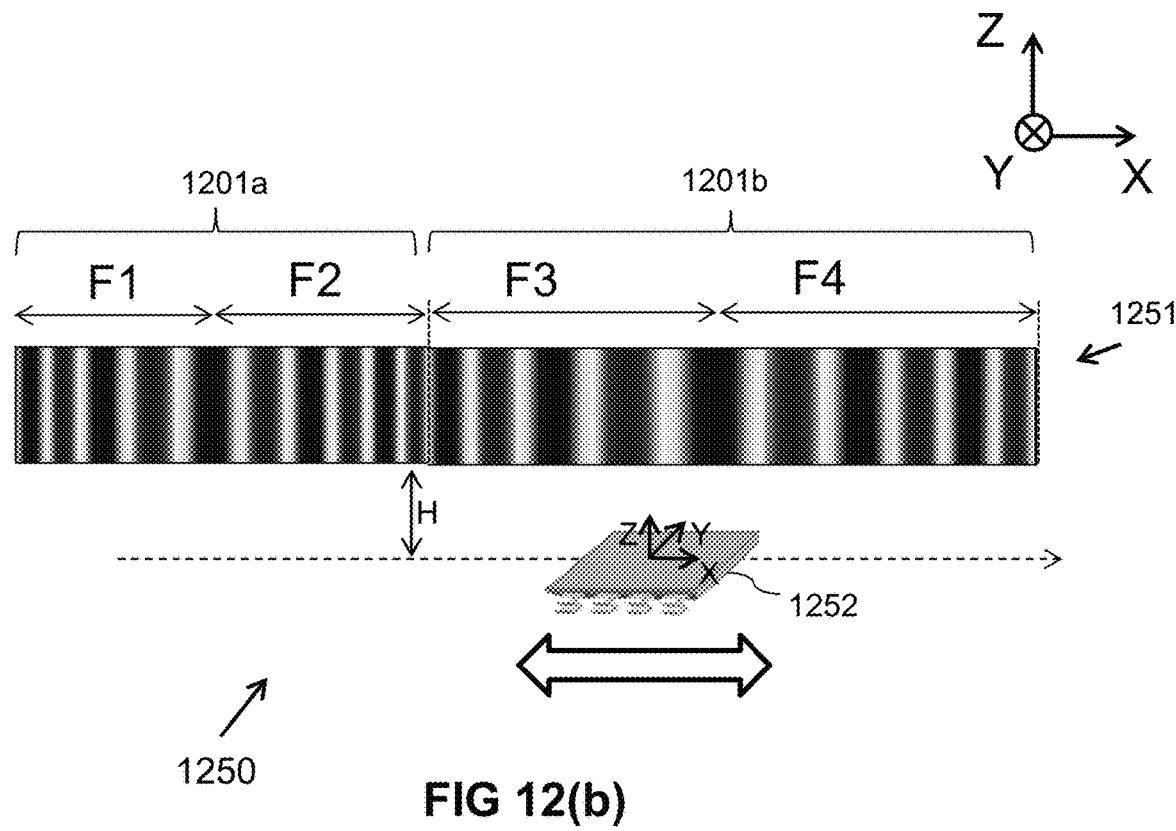
FIG. 12(b) shows a schematic block-diagram of another linear position sensor system according to an embodiment of the present invention, comprising two magnets as described in FIG. 12(a), positioned adjacent each other.

FIG. 12(b) shows a system 1250 comprising at least two magnetic structures 1201a, 1201b as shown in FIG. 12(a), each structure having different factors (e.g. F1, F2, F3, F4). Again, factors are only used here for easy of explanation, but they are not absolutely required. It suffices that the distances are different. In the specific example shown, the system comprises: (i) a first magnetic structure 1201a identical to that of FIG. 12(a) having a first portion in which the distances increase by a factor F1, and a second portion in which the distances decrease by a factor F2 different from F1, and (ii) a second magnetic structure 1201b having a first portion in which the distances increase by a factor F3 different from F1 and F2, and a second portion in which the distances decrease by a factor F4 different from any of F1 to F3.

While the system of FIG. 12(b) contains only two different magnetic structures 1201a, 1201b, of course the present invention is not limited thereto, and in other embodiments, the system 1250 may have 3 different magnets, or 4 different magnets, or even more, allowing to determine a unique position over an even larger range, with high accuracy, and in a manner which is highly robust against an external disturbance field, and against magnetic degradation and temperature variations.

An advantage of using magnetic structures having a first portion with increasing pole distances and a second portion with decreasing pole distances, mounted adjacent each other, is that the magnetic signals will vary more smoothly near the transitions between the different magnetic structures, rather than abruptly. This offers the further advantage that the coarse signal(s) Sc and the fine signal(s) Sf derived therefrom may be less erratic, and that the linear position derived therefrom may be more accurate. Indeed, although not explicitly shown, a combined magnetic structure as shown in FIG. 12(b) will have a coarse signal with four zones: a first zone related to factor F1, a second zone related to factor F2, a third zone related to factor F3 and a fourth zone related to factor F4, but in contrast to the left end and the right end of the signals shown in FIG. 13(a) to FIG. 13(c), advantageously, the signals of the combined structure will vary smoothly not only between the first and second zone, and between the third and fourth zone, but also between the second and third zone. Since the slope of each of these four zones is different, the probability that a particular value of the fine signal corresponds to only one coarse signal is very high, which can easily be verified by performing a simulation using specific dimensions and factors.

The sensor device 1252 can find the unique position relative to the combined magnetic structure 1251 in the same or a similar manner as described above (see e.g. FIG. 3(h)), by first determining a set of candidate positions based on the fine signal only, and then selecting the best of these candidate positions, by looking also at the coarse signal (or coarse signals). In this way, the unique position can be determined with respect to the total length formed by the two (or more) magnetic structures.

In an alternative embodiment, the position sensor system (not shown) comprises four different magnetic structures, e.g. each magnetic structure (as shown in FIG. 1) having monotonically increasing distances with a different predefined factor F1 to F4:
i) a first magnetic structure with factor F1 for the first zone,
ii) a second magnetic structure with factor F2 for the second zone, but turned by 180° such that the transition between the end of the first magnetic structure and the beginning of the second magnetic structure is less abrupt,
iii) a third magnetic structure with factor F3 for the third zone,
iv) a fourth magnetic structure with factor F4 for the fourth zone, but turned by 180° such that the transition between the end of the third magnetic structure and the beginning of the fourth magnetic structure is less abrupt.

By choosing four different factors F1 to F4, a magnetic structure identical or very similar to the one shown in FIG. 12(b) will be obtained. The magnetic field generated by such a structure can be simulated, in a similar manner as described above, and curves similar to those shown in FIG. 13(a) to FIG. 13(c) but with two increasing portions and two decreasing portions can be generated, and the sensor device can be configured to find a unique position along this combined magnetic structure, in a manner similar as described above.

FIG. 14(a) and FIG. 14(b) show an axially magnetized ring magnet 1401, in top view and perspective view respectively. This magnet can be seen as a variant of the ring magnet shown in FIGS. 2(a) and 2(b). The magnet 1401 comprises a plurality of poles (in the example: 10 poles can be seen at the top surface). The angular distances $\alpha 1$, $\alpha 2$, $\alpha 3$, $\alpha 4$, $\alpha 5$, $\alpha 6$ between centres of adjacent poles (measured at the periphery of the ring magnet) increases over a first portion of the ring magnet (from $\alpha 1$ to $\alpha 6$), and the angular distances $\alpha 6$, $\alpha 7$, $\alpha 8$, $\alpha 9$, $\alpha 10$, $\alpha 1$ decrease over a second portion of the ring magnet (from $\alpha 6$ to $\alpha 10$), e.g. when "walking" at the periphery in clockwise direction. (the same is true in counterclockwise direction). Or expressed in mathematical terms, in the example shown in FIG. 14(a), $\alpha 1$ is the smallest angular distance and $\alpha 6$ is the largest angular distance, and $\alpha 1 < \alpha 2 < \alpha 3 < \alpha 4 < \alpha 5 < \alpha 6$, and $\alpha 6 > \alpha 7 > \alpha 8 > \alpha 9 > \alpha 10$. As can be seen, by choosing $\alpha 10$ only slightly different from $\alpha 1$, the transition from $\alpha 10$ to $\alpha 1$, or vice versa, will be very smooth.

Or stated in simple terms, FIG. 14(a) and FIG. 14(b) show a ring magnet, which is axially magnetized, and has a plurality of "pie segments" of different sizes. The sizes vary in such a way, that, when starting from the pie having the smallest size, and turning in clockwise direction, the size of the pie segments encountered first increase, and then decrease.

Said angular distances may increase with a first predefined factor F1 in said first angular portion, and may decrease with a second predefined factor F2, different from the first predefined factor F1, over said second angular portion. But as already mentioned above, a constant factor for each portion is not required, but helps to explain the invention in a simple manner. It suffices that the distances are different. The number of pies in the first angular portion (wherein the distances increase) may be the same as the number of pies in the second angular portion (wherein the distances decrease), or may be different from the number of pies in the second angular portion.

Preferably the magnet is asymmetric.

In an embodiment, the smallest circle segment defined by $\alpha 1$ is not located diametrically opposite the largest circle segment defined by $\alpha 6$.

In an embodiment, the smallest circle segment defined by $\alpha 1$ is located diametrically opposite the largest circle segment defined by $\alpha 6$.

Some specific examples will be given further (when discussing FIG. 18).

In the example of FIG. 14(a) and FIG. 14(b), the angular distances are preferably chosen such that $\alpha 10$ is only slightly larger than $\alpha 1$, which is not the case in FIG. 9, where the angular distance changes abruptly from segment P10 to segment P1.

Figure 16A:
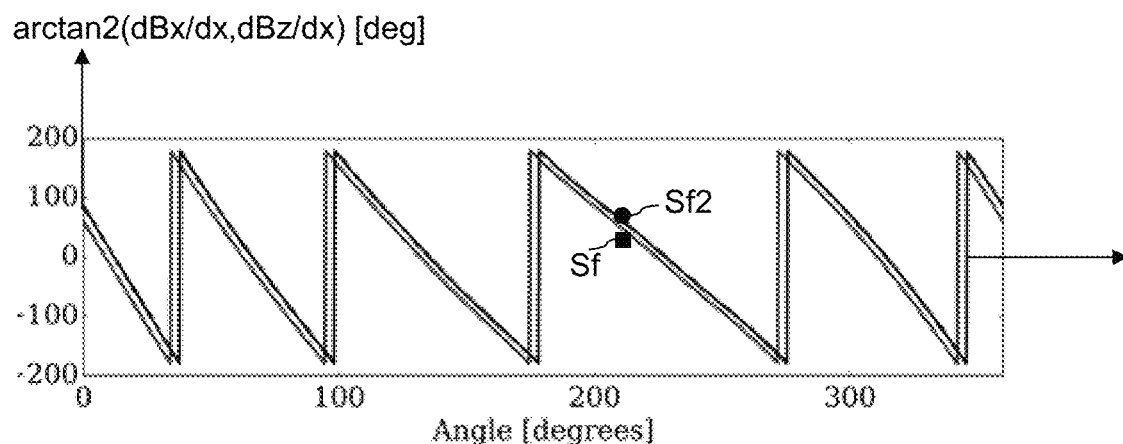
FIG. 16(a) to FIG. 16(c) show signals obtainable by the position sensor of FIG. 15(a), which can be seen as variants of the signals of FIG. 3(e) to FIG. 3(g).
Figure 16B:
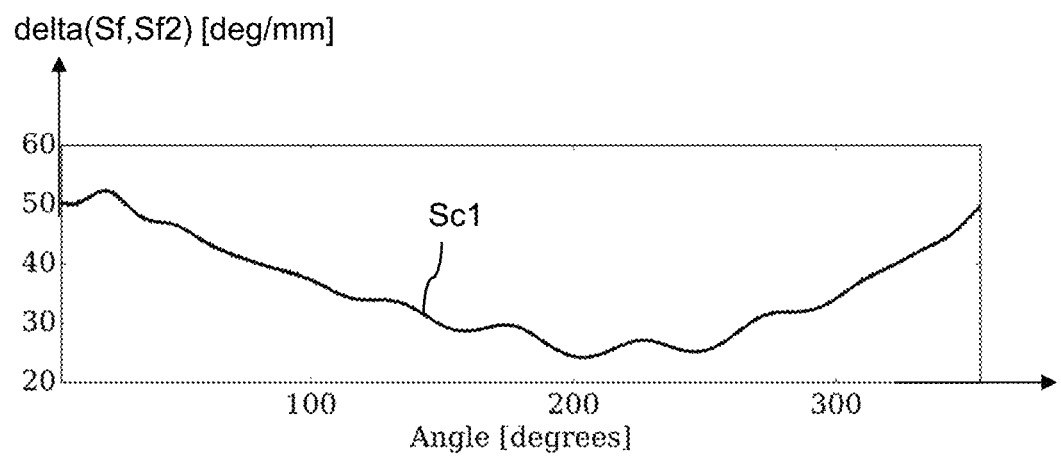
Figure 16C:
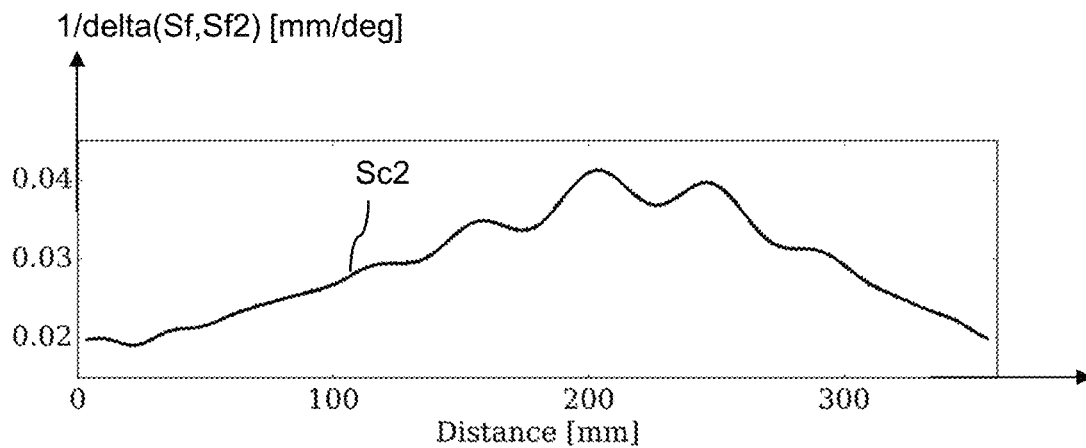

The main advantage of the increasing and decreasing angular distances can be appreciated from FIG. 16(a) to FIG. 16(c), showing that the fine signals Sf1, Sf2 and the coarse signals Sc1, Sc2 are continuous (near 0° and 360°) and vary more smoothly, and are less erratic. This offers the further advantage that the angular position derived from these signals is more accurate over the entire 360° range.

FIG. 15 shows an angular position sensor system 1500 comprising an axially magnetized magnet 1501 like the one shown in FIGS. 14(a) and 14(b), and a position sensor device 1502 located offset (distance Rs) from the rotation axis, facing a bottom surface of the magnet 1501. This sensor system 1500 can be seen as a variant of the sensor system of FIGS. 2(a) and 2(b), and the same principles and formulas apply, but the specific data, which is e.g. stored in the non-volatile memory of the sensor device, is based on fine and coarse signals as shown in FIG. 16(a) to FIG. 16(c). As mentioned above, this data can be determined by simulation and/or by calibration, or in any other suitable way.

FIG. 16(a) to FIG. 16(c) is already discussed in relation with FIG. 14(a) and FIG. 14(b).

FIG. 17(a) and FIG. 17(b) show a radially magnetized ring magnet 1701, in top view and in perspective view respectively. This magnet 1701 can be seen as a variant of the magnet of FIGS. 14(a) and 14(b), except that this magnet is radially magnetized rather than axially magnetized. Everything else described above for the axially magnetized magnet 1401 of FIGS. 14(a) and 14(b), is also applicable for the radially magnetized magnet 1701 of FIGS. 17(a) and 17(b), in particular related to the angular distances α1 to α10, the first portion in which the distances increase, and the second portion in which the distances decrease.

FIG. 18 shows an angular position sensor system 1800 comprising a radially magnetized magnet 1801 like the one shown in FIGS. 17(a) and 17(b), and a position sensor device 1802 located outside of the magnet, at a radial distance Rs from the rotation axis larger than the outer radius of the ring magnet. The sensor device 1802 is facing a cylindrical side surface of the magnet. The sensor device contains a semiconductor substrate. A coordinate system with three orthogonal axes X,Y,Z is attached to the sensor device such that the X and Y axis are parallel to the semiconductor plane, and the Z-axis is orthogonal to the semiconductor plane.

The sensor device 1802 is configured for measuring an "in-plane" gradient dBx/dx of a magnetic field component Bx along the X-direction (parallel to the semiconductor substrate), and an "out-of-plane" gradient dBz/dx of a magnetic field component Bz oriented in the Z-direction (perpendicular to the semiconductor substrate) along the X-direction. The sensor device 1802 is oriented such that the X-axis is oriented in a circumferential direction of the magnet, i.e. tangential to an imaginary circle having a center on the rotation axis of the magnet 1801, and such that the Z-axis is oriented in a radial direction of the magnet. As a consequence, the Y-axis is parallel to the rotation axis of the magnet, Bx is oriented in a circumferential direction of the magnet, and Bz is oriented in a radial direction of the magnet.

This sensor device 1802 of FIG. 18 will measure signals Bx and Bz which are very similar to the signals measured by the sensor device of FIG. 15, and hence also the gradient signals dBx/dx and dBz/dx are very similar, and from these gradient signals, a fine signal Sf and a coarse signal Sc can be derived, similar to what is shown in FIG. 16(a) to FIG. 16(c).

In a variant (not shown) of the magnet of FIGS. 14(a) and 14(b) and FIGS. 17(a) and 17(b), the ring magnet has exactly four pie segments, with four different pie sizes, namely size1, size2, size3, size4, wherein size1 is the smallest size, and size3 is the largest size, and wherein:
a) size1<size4<size2<size3, or
b) size1<size2<size4<size3

In a particular example of (a), the sizes are: size1=70°, size2=95°, size3=110°, and size4=85°.

In a particular of (b), the sizes are: size1=70°, size2=85°, size3=110°, and size4=95°.

But of course the present invention is not limited to these particular examples, and the skilled person having the benefit of the present disclosure can easily find other suitable values.

In another variant (not shown) of the magnet of FIGS. 14(a) and 14(b) and FIGS. 17(a) and 17(b), the ring magnet has exactly six pie segments, with six different pie sizes, namely size1, size2, size3, size4, size5, size6, wherein size1 is the smallest size, and size4 is the largest size, and wherein:
a) size1<size6<size2<size5<size3<size4, or
b) size1<size6<size2<size3<size5<size4, or
c) size1<size2<size6<size5<size3<size4, or
d) size1<size2<size6<size3<size5<size4.

In a particular example of (a), the sizes are: size1=30°, size6=42°, size2=55°, and size5=65°, size3=78° and size4=90°. But of course the present invention is not limited to this particular example, and the skilled person having the benefit of the present disclosure can easily other find suitable values.

The invention claimed is:

1. A magnetic structure comprising a plurality of poles; and
   a plurality of distances between centres of two adjacent poles;
   wherein the magnetic structure forms an elongated shape having a longitudinal axis or a curved shape having a curved axis;
   wherein a ratio of any two adjacent distances of the plurality of distances is a value in a range of 105% to 800%.

2. The magnetic structure according to claim 1, wherein the magnetic structure is an assembly of a plurality of discrete permanent magnets; or
   wherein the magnetic structure comprises a monolithic magnetic material which is magnetized such that the plurality of poles comprises a plurality of alternating poles oriented in opposite directions.

3. The magnetic structure according to claim 1, wherein the magnetic structure has a remanent magnetic field oriented substantially perpendicular to the longitudinal axis; or
   wherein the magnetic structure has a remanent magnetic field oriented substantially perpendicular to the curved axis.

4. The magnetic structure according to claim 1, wherein the magnetic structure comprises a ring magnet or a disk magnet.

5. The magnetic structure according to claim 1, wherein a number of the plurality of poles is in a range of 3 to 50.

6. The magnetic structure according to claim 1, wherein the magnetic structure has an asymmetric shape.

7. The magnetic structure of claim 1, wherein the plurality of distances between centres of two adjacent poles vary strictly monotonically in a first direction along said longitudinal axis or said curved axis.

8. The magnetic structure of claim 7, wherein the distance varies linearly with a pole number or quadratically with the pole number.

9. A magnetic structure comprising a plurality of poles;
   wherein a distance between centres of any combination of two adjacent poles of the plurality of poles is different from distances between centres of any other combination of two adjacent poles of the plurality of poles;

wherein a ratio between a maximum distance between two adjacent poles of the plurality of poles and a minimum distance between two adjacent poles of the plurality of poles is in a range of 105% to 800%.

10. The magnetic structure according to claim 9, wherein the ratio between the maximum distance between two adjacent poles of the plurality of poles and the minimum distance between two adjacent poles of the plurality of poles is in a range of 110% to 200%.

11. The magnetic structure according to claim 9, wherein the magnetic structure has an asymmetric shape.

12. The magnetic structure according to claim 9, wherein the magnetic structure is an assembly of a plurality of discrete permanent magnets; or
wherein the magnetic structure comprises a monolithic magnetic material which is magnetized such that the plurality of poles comprises a plurality of alternating poles oriented in opposite directions.

13. The magnetic structure according to claim 9, wherein the magnetic structure has an elongated shape having a longitudinal axis and a remanent magnetic field oriented substantially perpendicular to the longitudinal axis; or
wherein the magnetic structure has a curved shape having a curved axis and a remanent magnetic field oriented substantially perpendicular to the curved axis.

14. The magnetic structure according to claim 9, wherein the magnetic structure forms an elongated shape having a longitudinal axis or a curved shape having a curved axis;
wherein the distance between the centres of two adjacent poles of the plurality of poles varies along the longitudinal axis or the curved axis by a first predetermined factor or a second predetermined factor.

15. A magnetic structure comprising a plurality of poles forming a ring magnet or a disk magnet;
wherein a distance between centres of any combination of two adjacent poles of the plurality of poles is different from distances between centres of any other combination of two adjacent poles of the plurality of poles;
wherein each of the plurality of poles comprises a wedge-shaped segment of the magnetic structure spanning different arc segments of a periphery of the ring magnet or the disk magnet, the magnetic structure comprising exactly four wedge-shaped segments, with each of the four wedge-shaped segments having a different size; or
exactly six wedge-shaped segments, with each of the six wedge-shaped segments having a different size.

16. The magnetic structure according to claim 15, wherein the magnetic structure is an assembly of a plurality of discrete permanent magnets; or
wherein the magnetic structure comprises a monolithic magnetic material which is magnetized such that the plurality of poles comprises a plurality of alternating poles oriented in opposite directions.

17. The magnetic structure according to claim 15, wherein the magnetic structure has a curved shape having a curved axis and a remanent magnetic field oriented substantially perpendicular to the curved axis.

18. The magnetic structure according to claim 15, wherein the magnetic structure forms a curved shape having a curved axis;
wherein the distance between the centres of two adjacent poles of the plurality of poles varies along the curved axis by a first predetermined factor or a second predetermined factor.

19. The magnetic structure according to claim 15, wherein the wedge-shaped segments of the magnetic structure have straight, radially oriented sides extending from the respective arc segment of the periphery.

20. The magnetic structure according to claim 15, wherein the magnetic structure is axially or radially magnetized.

* * * * *